US012785713B2

(12) United States Patent
Tu et al.

(10) Patent No.: US 12,785,713 B2
(45) Date of Patent: Nov. 3, 2026

(54) ANALOG TO DIGITAL CONVERTER, METHOD AND CIRCUIT FOR DETECTING DEFECT THEREIN

(71) Applicant: MONTAGE TECHNOLOGY (KUNSHAN) CO., LTD., Suzhou (CN)

(72) Inventors: Wei Tu, Suzhou (CN); Lixin Jiang, Suzhou (CN); Xuejian Li, Suzhou (CN)

(73) Assignee: MONTAGE TECHNOLOGY (KUNSHAN) CO., LTD., Suzhou (CN)

( * ) Notice: Subject to any disclaimer, the term of this patent is extended or adjusted under 35 U.S.C. 154(b) by 123 days.

(21) Appl. No.: 18/986,728

(22) Filed: Dec. 19, 2024

(65) Prior Publication Data

US 2026/0031830 A1 Jan. 29, 2026

(30) Foreign Application Priority Data

Dec. 19, 2023 (CN) ........................ 202311745847.8

(51) Int. Cl.
*H03M 1/46* (2006.01)
*H03M 1/10* (2006.01)

(52) U.S. Cl.
CPC ......... *H03M 1/462* (2013.01); *H03M 1/1071* (2013.01)

(58) Field of Classification Search
CPC .......... H03M 1/10; H03M 1/46; H03M 1/462; H03M 1/468; H03M 1/1071
See application file for complete search history.

(56) References Cited

U.S. PATENT DOCUMENTS

| | | | | |
|---|---|---|---|---|
| 6,211,803 | B1 * | 4/2001 | Sunter .................... | H03M 1/109 341/120 |
| 6,958,722 | B1 * | 10/2005 | Janakiraman ......... | H03M 1/144 341/161 |

(Continued)

FOREIGN PATENT DOCUMENTS

| | | | |
|---|---|---|---|
| CN | 106712772 | A | 5/2017 |
| CN | 107171667 | A | 9/2017 |

(Continued)

OTHER PUBLICATIONS

Search Report for the counterpart Chinese patent application 202311745847.8, mailed on Jan. 22, 2025.

*Primary Examiner* — Lam T Mai
(74) *Attorney, Agent, or Firm* — Junhe Law Office P.C.; James J. Zhu

(57) ABSTRACT

An analog-to-digital converter and a method and circuit for detecting a defect in the convertor are provided. The converter has a built-in self-test function and includes: an SAR ADC based on a redundant coding scheme; an inputting unit configured for inputting a defect-sensitive voltage into the SAR ADC; a controlling unit configured for controlling the SAR ADC to perform an analog-to-digital conversion on the defect-sensitive voltage, wherein the controlling includes the following steps: (a) setting a $k^{th}$ bit in one of the plurality of K-bit binary numbers to a fixed value; (b) controlling the SAR ADC to generate an output digital code $D_{out}(k)$; and (c) changing a value of k and cycling through step (a) to step (b) to generate K output digital codes $D_{out}(k)$; and a determining unit configured for determining whether the SAR ADC has a defect based on the K output digital codes $D_{out}(k)$.

20 Claims, 12 Drawing Sheets

(56) References Cited

U.S. PATENT DOCUMENTS 8,390,497 B2 * 3/2013 Steensgaard-Madsen .................. H03M 1/0675 341/155
8,766,839 B2 * 7/2014 Janakiraman ....... H03M 1/0697 341/161
8,933,830 B1 1/2015 Jeon
9,000,960 B2 * 4/2015 D'Souza ................ H03M 1/50 341/161
9,030,346 B2 5/2015 Dey et al.
9,467,161 B1 * 10/2016 Kim ...................... H03M 1/145
9,473,164 B1 * 10/2016 Chen ..................... H03M 1/468
9,484,945 B1 * 11/2016 Wan ........................ H03M 1/46
9,608,658 B1 * 3/2017 Rajaee ................ H03M 1/1009
10,097,198 B1 * 10/2018 Lee ......................... H03M 1/68
10,291,252 B1 * 5/2019 Farid ..................... H03M 1/468
10,790,842 B1 * 9/2020 Paussa .................. H03M 1/069
10,951,225 B1 * 3/2021 Shannon ............... H03M 1/462
11,463,098 B2 * 10/2022 Bal ......................... H03M 1/46
2005/0057387 A1 * 3/2005 Janakiraman ........... H03M 1/06 341/172
2010/0066583 A1 * 3/2010 Jeon ...................... H03M 1/164 341/161
2010/0109924 A1 * 5/2010 Cho .................... H03M 1/0695 341/118
2012/0154193 A1 * 6/2012 Chang ................... H03M 1/145 341/156
2015/0263756 A1 * 9/2015 Chiu ....................... H03M 1/08 341/172
2017/0126243 A1 * 5/2017 Liu ..................... H03M 1/1245
2018/0198457 A1 * 7/2018 Fan ....................... H03M 1/004
2019/0081636 A1 * 3/2019 Chen ..................... H03M 1/002
2019/0173479 A1 * 6/2019 Dyachenko ......... H03M 1/0641
2020/0057106 A1 * 2/2020 Balasubramanian ........................ G01R 31/3167
2021/0203349 A1 * 7/2021 Chung .................. H03M 1/468
2022/0006467 A1 * 1/2022 Bal ......................... H03M 1/46
2024/0187016 A1 * 6/2024 Parupalli ............... H03M 1/804

FOREIGN PATENT DOCUMENTS

CN 112202449 A 1/2021
CN 113890536 A 1/2022
CN 114039604 A 2/2022
EP 2288033 B1 12/2014

* cited by examiner

| | | | | | | | | | | | | | |
|---|---|---|---|---|---|---|---|---|---|---|---|---|---|
| Normal | 10000 | | 11000 | | 11100 | | 11010 | | 11001 | | 11000 | |
| Bit4=0 | 10000 | → | 10000 | → | 10100 | → | 10110 | → | 10101 | → | 10101 | ≈ 9 ≈ Ain + eq |
| Bit5=0 | 00000 | | 01000 | | 01100 | | 01110 | | 01111 | | 01110 | |
| Bit3=1 | 10100 | | 11100 | | 10100 | | 10110 | | 10101 | | 10101 | |

| | | | | | | | |
|---|---|---|---|---|---|---|---|
| Normal | 10000 | 11000 | 11100 | 11010 | 11011 | 11010 | ≈ 11 |
| Bit4=0 | 10000 | 10000 | 10100 | 10110 | 10111 | 10111 | ≈ 11 |
| Bit5=0 | 00000 | 01000 | 01100 | 01010 | 01011 | 01010 | ≈ 6 |
| Bit3=1 | 10100 | 11000 | 10100 | 10110 | 10111 | 10111 | ≈ 11 |

| | | | | | | | |
|---|---|---|---|---|---|---|---|
| Normal | 10000 | 11000 | 11000 | 11010 | 11011 | 11011 | = 12 |
| Bit4=0 | 10000 | 10000 | 10100 | 10010 | 10011 | 10011 | = 8 |
| Bit5=0 | 00000 | 01000 | 01100 | 01010 | 01011 | 01011 | = 7 |
| Bit3=1 | 10100 | 01100 | 00100 | 00110 | 00101 | 00100 | = 3 |

| | | | | | | | | | | | |
|---|---|---|---|---|---|---|---|---|---|---|---|
| Normal | 10000 | | 11000 | | 11100 | | 11010 | | 11001 | | 11000 | = 9 |
| Bit4=0 | 10000 | → | 10000 | → | 10100 | → | 10010 | → | 10011 | → | 10010 | = 7 |
| Bit5=0 | 00000 | | 01000 | | 01100 | | 01110 | | 01111 | | 01110 | = 9 |
| Bit3=1 | 10100 | | 01100 | | 01100 | | 01110 | | 01111 | | 01110 | = 9 |

ANALOG TO DIGITAL CONVERTER, METHOD AND CIRCUIT FOR DETECTING DEFECT THEREIN

CROSS REFERENCE TO RELATED APPLICATIONS

This application claims priority to Chinese patent application No. 202311745847.8 filed on Dec. 19, 2023, the entire content of which is incorporated herein by reference.

TECHNICAL FIELD

This application relates to the field of integrated circuits, and more particularly, to an analog-to-digital converter with a built-in self-test function, a method for detecting a defect in an analog-to-digital conversion circuit, and a test circuit for detecting defects in an analog-to-digital conversion circuit.

BACKGROUND OF THE INVENTION

An analog-to-digital converter (ADC) is a device used to convert analog signals to digital signals. A successive-approximation register analog-to-digital converter (SAR ADC) is a commonly used ADC. After sampling an analog input signal, the SAR ADC compares the sampled analog input signal with reference voltages generated under control of an SAR logic circuit to produce a corresponding output digital signal. The SAR ADC is widely used in audio processing, video processing, signal processing, etc.

The SAR ADC generally includes capacitors, switches, comparators, and other devices. Some of these devices may have manufacturing defects. For example, the capacitors may have an inaccurate capacitance, the switches may not work properly, the comparators may not work properly and the like. These defects may cause incorrect outputs of the SAR ADC. In order to detect defects in the SAR ADC, different analog test voltages may be input into the SAR ADC under test to determine whether the output value is correct, or a dedicated test circuit may be used to test the SAR ADC. However, the conventional SAR ADC test methods or devices have disadvantages such as a long test time and a high system overhead.

SUMMARY OF THE INVENTION

An object of the present application is to provide a method or a device for detecting a defect in a successive-approximation-register analog-to-digital conversion circuit, which can detect the defect in the successive-approximation-register analog-to-digital conversion circuit quickly with low cost.

According to an aspect of the present application, an analog-to-digital converter having a built-in self-test function is provided. The analog-to-digital converter may include: a successive-approximation-register analog-to-digital conversion circuit (SAR ADC) based on a redundant coding scheme; an inputting unit configured for inputting a defect-sensitive voltage into the SAR ADC, wherein a magnitude of the defect-sensitive voltage is representable by a plurality of K-bit binary numbers, and K is a positive integer; a controlling unit configured for controlling the SAR ADC to perform an analog-to-digital conversion on the defect-sensitive voltage, wherein the controlling includes the following steps: (a) setting a $k^{th}$ bit in one of the plurality of K-bit binary numbers output by the SAR ADC to a fixed value; (b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and a determining unit configured for determining whether the SAR ADC has a defect based on the K output digital codes $D_{out}(k)$.

According to another aspect of the present application, a method for detecting a defect in an analog-to-digital conversion circuit is provided. The method may include: inputting a defect-sensitive voltage into a successive-approximation-register analog-to-digital conversion circuit (SAR ADC) based on a redundant coding scheme, where a magnitude of the defect-sensitive voltage is representable by a plurality of K-bit binary numbers; controlling the SAR ADC to perform an analog-to-digital conversion on the defect-sensitive voltage, and the controlling includes the following steps: (a) setting a $k^{th}$ bit in one of the plurality of K-bit binary numbers output by the SAR ADC to a fixed value; (b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and determining whether the SAR ADC has a defect based on the K output digital codes $D_{out}(k)$.

According to another aspect of the present application, a test circuit for detecting a defect in an analog-to-digital conversion circuit is provided. The test circuit may include: an inputting unit configured for inputting a defect-sensitive voltage into a successive-approximation-register analog-to-digital conversion circuit (SAR ADC) based on a redundant coding scheme, wherein a magnitude of the defect-sensitive voltage is representable by a plurality of K-bit binary numbers, and K is a positive integer; a controlling unit configured for controlling the SAR ADC to perform an analog-to-digital conversion on the defect-sensitive voltage, wherein the controlling includes the following steps: (a) setting a $k^{th}$ bit in one of the plurality of K-bit binary numbers output by the SAR ADC to a fixed value; (b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and a determining unit configured for determining whether the SAR ADC has a defect based on the K output digital codes $D_{out}(k)$.

The foregoing is a summary of the present application and may be simplified, summarized, or omitted in detail, so that a person skilled in the art shall recognize that this section is merely illustrative and is not intended to limit the scope of the application in any way. This summary is neither intended to define key features or essential features of the claimed subject matter, nor intended to be used as an aid in determining the scope of the claimed subject matter.

BRIEF DESCRIPTION OF DRAWINGS

The abovementioned and other features of the present application will be more fully understood from the following specification and the appended claims, taken in conjunction with the drawings. It can be understood that these drawings depict several embodiments of the present application and therefore should not be considered as limiting the scope of the present application. By applying the drawings, the present application will be described more clearly and in detail.

DETAILED DESCRIPTION OF THE INVENTION

Figure 1:
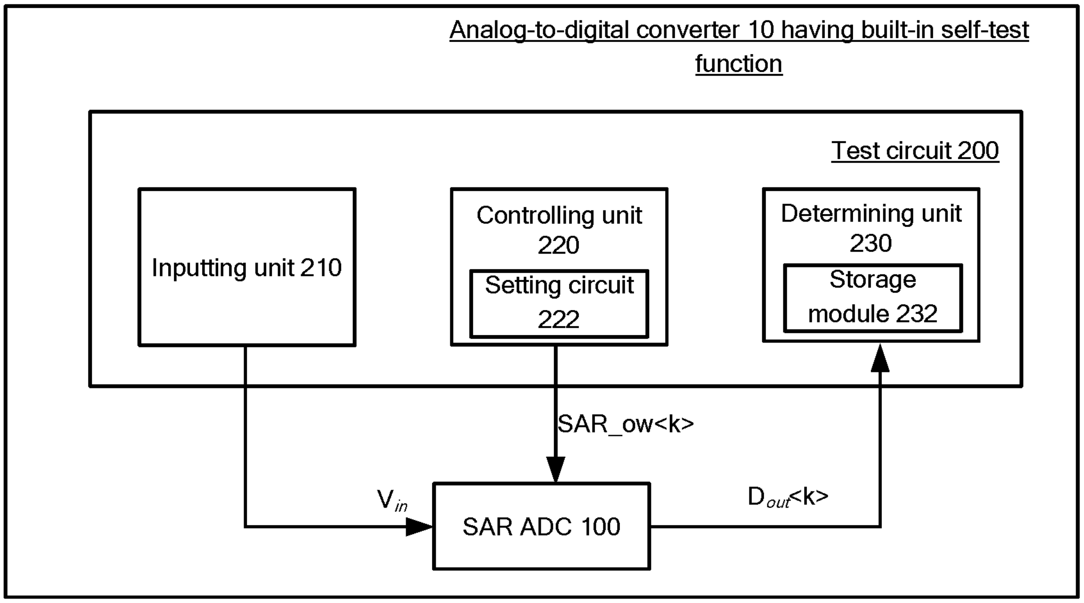
FIG. 1 is a block diagram illustrating an analog-to-digital converter having a built-in self-test function according to an embodiment of the present application.

The following detailed description refers to the drawings that form a part hereof. In the drawings, similar symbols generally identify similar components, unless context dictates otherwise. The illustrative embodiments described in the description, drawings, and claims are not intended to limit. Other embodiments may be utilized and other changes may be made without departing from the spirit or scope of the subject matter of the present application. It can be understood that numerous different configurations, alternatives, combinations and designs may be made to various aspects of the present application which are generally described and illustrated in the drawings in the application, and that all of which are expressly formed as part of the application.

A successive-approximation-register analog-to-digital converter (SAR ADC) generally includes a sample-and-hold circuit, a digital-to-analog converter (DAC), a comparator and a successive-approximation-register (SAR) logic circuit. The sample-and-hold circuit samples an analog input voltage $A_{in}$ to obtain an input voltage $V_{in}$, and holds the input voltage $V_{in}$; the DAC is configured to output a reference voltage $V_{DAC}$; and the comparator is configured to compare the input voltage $V_{in}$ with the reference voltage $V_{DAC}$ output by the DAC to produce a comparison result at each search step, and send the comparison result to the SAR logic circuit. The SAR logic circuit includes a controlling circuit (or controlling logic) and a register. The controlling circuit is configured to control a magnitude of the reference voltage $V_{DAC}$ output by the DAC according to the comparison result, and the register can store the comparison result, and after completing the analog-to-digital conversion through multiple search steps, output the comparison results stored therein as a digital code $D_{out}$.

According to a scheme of the coding design, the SAR ADC may include a non-redundant coding scheme and a redundant coding scheme. However, there may be a problem in a successive approximation algorithm based on the non-redundant coding scheme. That is, there is no overlap between different search intervals, and once a certain search interval is excluded, this search interval will not be searched again. This requires that a determination of each bit must not be wrong during operation of the SAR ADC. Once a failure occurs (for example, a capacitor in the DAC has a defect), the digital code cannot be generated correctly, resulting in a conversion result of the ADC having an error much greater than a quantization tolerance.

A successive approximation algorithm based on the redundant coding scheme sets multiple search intervals with overlapping windows, such that an error caused by a mistake in determining a certain bit in the overlapping search interval can be compensated in subsequent conversion steps, where the overlapping search intervals can be referred as redundant windows, and sizes of the redundant windows may be determined according to a specific circuit design. An SAR ADC based on the redundant coding scheme can be implemented in various ways. For example, one is to reduce a weight factor (i.e., the sub_radix2 algorithm); another is to insert an additional determining bit in a binary-weighted capacitor array, where the determining bit has a same weight as an adjacent bit and is referred as a redundant bit; and still another is to use an unfixed weight factor, which only needs to ensure that an average radix is less than 2.

Generally, for an SAR ADC having a K-bit output digital code $D_{out}$, its conversion result can be expressed by the following Equation (1):

$$D_{out} = \sum_{1}^{K} W_k * SAR_k = V_{in} + e_q; \quad \text{Equation (1)}$$

wherein $D_{out}$ represents an output digital code, K represents a total number of bits of the output digital code $D_{out}$, $SAR_k$ represents a value of the $k^{th}$ bit of the output digital code $D_{out}$ ($SAR_k$ will also be represented by $Bit_k$ in the following text), $W_k$ represents a weight of the $k^{th}$ bit of the output digital code $D_{out}$, and $e_q$ represents a conversion error. For the SAR ADC based on the redundant coding scheme, the weight of each bit of its output digital code $D_{out}$ follows the following Equation (2), and its weight base follows the following Equation (3):

$$Et(n) = \sum_{k=0}^{n-1} W_k - W_n > 0, (K \geq n > 1); \quad \text{Equation (2)}$$

$$\sum_{k=0}^{K} \alpha^k \geq 2^N; \quad \text{Equation (3)}$$

wherein K represents a total number of bits of the output digital code $D_{out}$, $W_k$ and $W_n$ represent weights of the $k^{th}$ bit and the $n^{th}$ bit of the output digital code $D_{out}$ respectively; Et represents an error tolerance (that is, a size of a redundant window); Et(n) represents the redundant window of the $n^{th}$ bit of the output digital code $D_{out}$; $\alpha$ represents a weight radix; and $2^N$ represents a maximum value that the output digital code $D_{out}$ can represent.

An analog-to-digital converter with a built-in self-test (BIST) function is provided in embodiments of the present application. The converter may include the aforementioned SAR ADC based on the redundant coding scheme, and can detect a defect therein.

Referring to FIG. 1, a block diagram of an analog-to-digital converter 10 having a built-in self-test function is illustrated according to an embodiment of the present application. The analog-to-digital converter 10 includes an SAR ADC 100 and a test circuit 200 coupled with the SAR ADC 100, where the test circuit 200 is configured to detect a defect in the SAR ADC 100.

The SAR ADC 100 is an SAR ADC based on a redundant coding scheme. For example, the SAR ADC 100 may be implemented using the aforementioned coding scheme having a reduced weight factor or having an unfixed weight factor. The SAR ADC 100 is configured to convert an input voltage $V_{in}$ to an output digital code $D_{out}$, and thus the input voltage $V_{in}$ can be quantized to a value ranging from 0 to (M−1). Each value in the range from 0 to (M−1) represents a quantization interval, and a total number of the quantization intervals is M. Each quantization interval is the smallest unit that the ADC can distinguish and/or represent. A size of each quantization interval can be represented by $LSB=V_{ref}/M$, where $V_{ref}$ is a reference voltage provided to the SAR ADC 100. The output digital code $D_{out}$ can be represented by a K-bit binary number, where M and K are both positive integers, and $2^K>M$.

Figure 2:
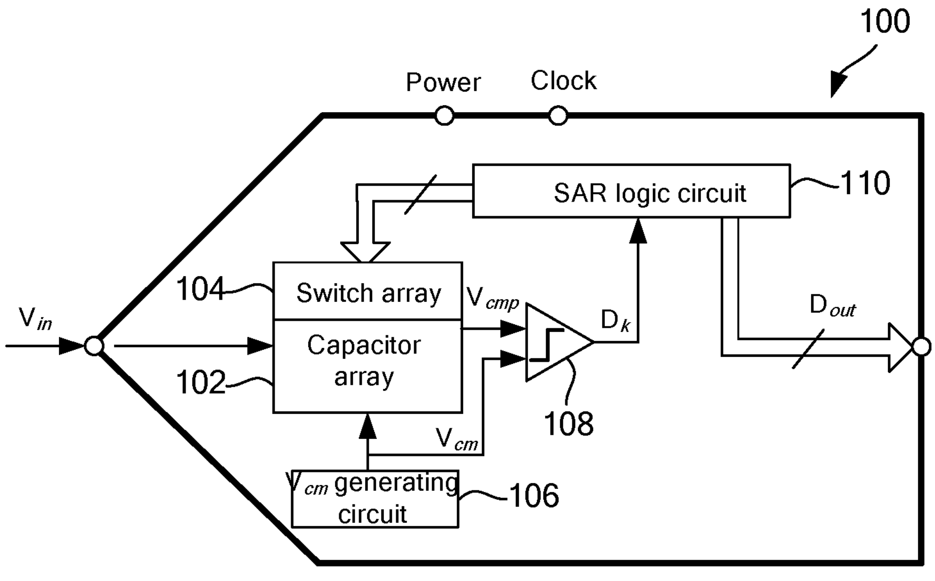
FIG. 2 is a block diagram illustrated a successive-approximation-register analog-to-digital conversion circuit (SAR ADC) included in an analog-to-digital converter having a built-in self-test function according to an embodiment of the present application.

Referring to FIG. 2, a block diagram of the SAR ADC 100 is illustrated according to an embodiment of the present application. Specifically, the SAR ADC 100 may include a capacitor array 102, a switch array 104, a common-mode voltage ($V_{cm}$) generating circuit 106, a comparator 108, and an SAR logic circuit 110. In the SAR ADC 100, the capacitor array 102 and the switch array 104 may be configured to achieve functions of sampling and holding a voltage to be converted in the SAR ADC 100.

The SAR ADC 100 may receive a power signal and a clock signal. The clock signal may include a sampling clock signal and a conversion clock signal, which respectively control the SAR ADC 100 to operate in a sampling phase or a conversion phase. In the sampling phase, the capacitor array 102 and the switch array 104 sample the voltage to be converted under the control of the sampling clock signal. In the conversion phase, the capacitor array 102 and the switch array 104 generate a comparison voltage $V_{cmp}$ based on a sampled input voltage $V_{in}$ and a code (for example, a K-bit binary number) provided by the SAR logic circuit 110 under the control of the conversion clock signal. The comparator 108 compares the comparison voltage $V_{cmp}$ with the common-mode voltage $V_{cm}$ to generate a comparison result $D_k$, and sends the comparison result to the SAR logic circuit 110 for storage, serving as one bit in the output digital code $D_{out}$. After completing the analog-to-digital conversion, a sequence of comparison results $D_k$ stored in the SAR logic circuit 110 constitutes the output digital code $D_{out}$.

Figure 3A:
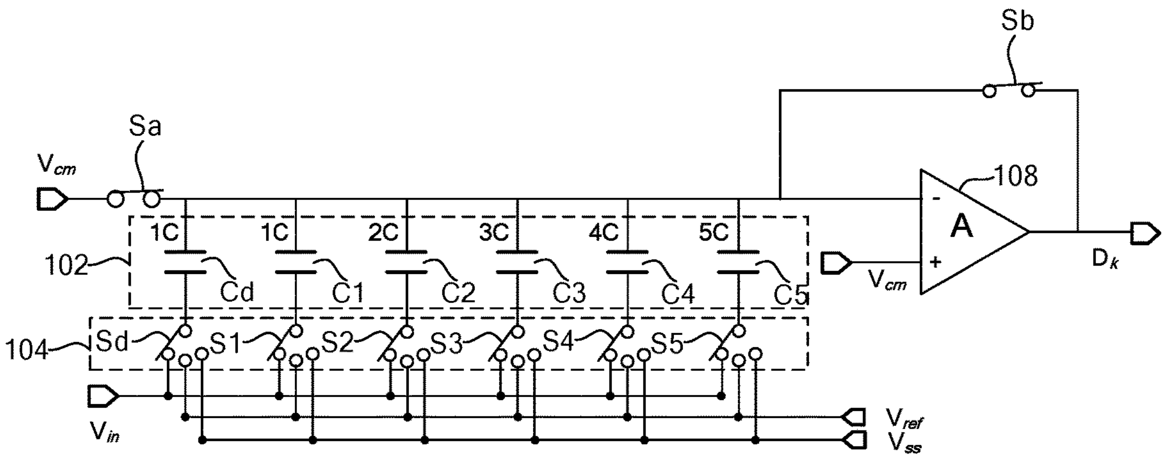
FIG. 3A and FIG. 3B are schematic diagrams of a capacitor array and a switch array of an SAR ADC operating in a sampling phase and in a conversion phase respectively, according to an embodiment of the present application.
Figure 3B:
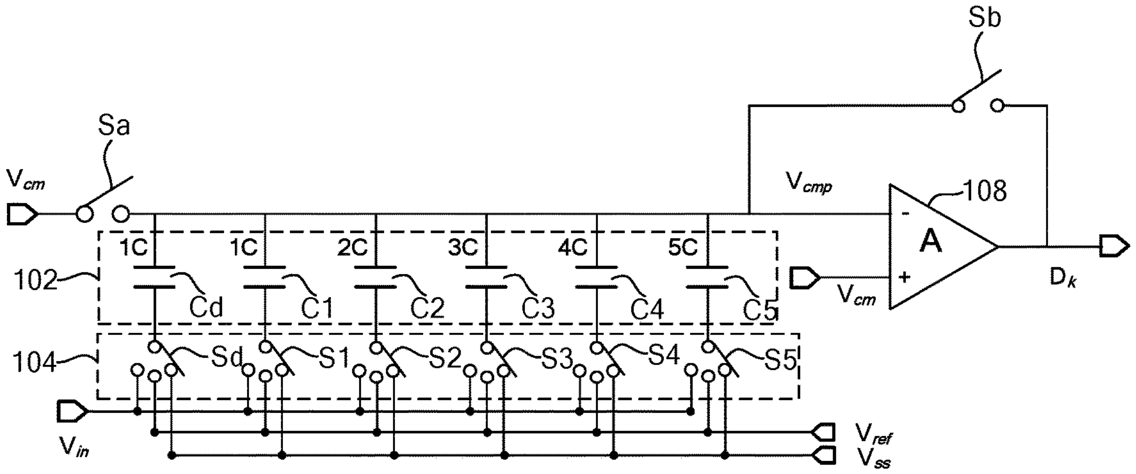

Referring to FIG. 3A and FIG. 3B, schematic diagrams of the capacitor array 102 and the switch array 104 used in the SAR ADC 100 having a 5-bit output digital code $D_{out}$ are illustrated according to a specific example. FIG. 3A illustrates a circuit diagram of the capacitor array 102 and the switch array 104 when the SAR ADC 100 is operating in the sampling phase; while FIG. 3B illustrates a circuit diagram of the capacitor array 102 and the switch array 104 when the SAR ADC 100 is operating in the holding or conversion phase.

As shown in FIGS. 3A and 3B, the capacitor array 102 includes five capacitors C1 to C5 connected in parallel, and the switch array 104 includes five switches S1 to S5 connected in parallel. A respective first terminal of each of the capacitors C1 to C5 is coupled to a switch Sa and a negative input terminal of the comparator 108, and a respective second terminal of each of the capacitors C1 to C5 is coupled to a first terminal of a corresponding one of the switches S1 to S5. A respective second terminal of each of the switches S1 to S5 can be switched among the input voltage $V_{in}$, the ground voltage $V_{ss}$ and the reference voltage $V_{ref}$.

In the example shown in FIG. 3A and FIG. 3B, the capacitances of the five parallel-connected capacitors C1 to C5 of the capacitor array 102 may be 1C, 2C, 3C, 4C and 5C respectively, where C is a common capacitance unit. In addition, the capacitor array 102 further includes a dummy capacitor Cd, and a capacitance of the dummy capacitor Cd may be 1C. A sum of the capacitance of all capacitors in the capacitor array 102 corresponds to the total number of quantization intervals (i.e., M) of the SAR ADC 100, that is, 5C+4C+3C+2C+1C+1C=16C. A maximum capacitance that the digital code $D_{out}$ output by the SAR ADC 100 corresponds to is: 5C+4C+3C+2C+1C=15C. In this example, the switches S1 to S5 can be switched among $V_{ref}$, $V_{in}$ and $V_{ss}$. Similarly, a first terminal of the dummy capacitor Cd is coupled to the switch Sa and the negative input terminal of the comparator 108, and a second terminal of the dummy capacitor Cd is coupled to a first terminal of a switch Sd, and a second terminal of the switch Sd can be switched between the input voltage $V_{in}$ and the ground voltage $V_{ss}$.

Before the SAR ADC 100 operates, the amounts of charges in all capacitors (Cd, and C1 to C5) in the capacitor array 102 are 0. As shown in FIG. 3A, during the sampling phase, the switches Sa and Sb are closed, and all switches (Sd, and S1 to S5) in the switch array 104 are switched to the input voltage $V_{in}$. At this moment, the first terminals of all capacitors (Cd, and C1 to C5) are coupled to the common-mode voltage $V_{cm}$ through the switch Sa, and the second terminals of them are electrically connected to the input voltage $V_{in}$ through the switches Sd and S1 to S5 in the switch array 104 respectively, such that each capacitor is charged by the input voltage $V_{in}$, and a voltage difference across each capacitor reaches ($V_{cm}-V_{in}$).

Next, as shown in FIG. 3B, the switch Sa and the switch Sb are disconnected, and each of the capacitors Cd and C1 to C5 is connected to the ground voltage $V_{ss}$ through a respective one of the switches Sd and S1 to S5. Since none of the capacitors has a discharge path, the voltage across each of the capacitors remains unchanged. At this moment, a comparison voltage at the negative input terminal of the comparator 108 is $V_{cmp}=V_{cm}-V_{in}$.

Then, the switches S1 to S5 in the switch array 104 receive a code from the SAR logic circuit 110, and under control of the code, the switches S1 to S5 are switched to the reference voltage $V_{ref}$ or remains connected to the ground voltage $V_{ss}$, so as to generate a voltage to be compared (an equation expressing the voltage to be compared can be found below). The input voltage $V_{in}$ is compared with the voltage to be compared. By outputting different codes and obtaining corresponding comparison results, the SAR logic circuit 110 uses the successive approximation algorithm to search for the voltage to be compared that is closest to the input voltage $V_{in}$ in the search interval, and the code corresponding to the closest voltage to be compared is the output digital code $D_{out}$. Specifically, in a $j^{th}$ (j is any positive integer between 1 and K) search step, the comparison voltage $V_{cmp}$ of the negative input terminal of the comparator 108 can be expressed by the following Equation (4):

$$V_{cmp} = V_{cm} - V_{in} + V_{ref} \times \frac{\sum_j C_{vref}}{\sum C}; \quad \text{Equation (4)}$$

wherein $\Sigma_j C_{vref}$ represents a sum of the capacitance of all capacitors in the capacitor array 102 that are coupled to the reference voltage $V_{ref}$ in the $j^{th}$ search step, and $\Sigma$ C represents a sum of the capacitance of all capacitors in the capacitor array 102.

A voltage difference $V_{diff}$ between the positive input terminal and the negative input terminal of the comparator 108 can be expressed by the following Equation (5):

$$V_{diff} = V_{cm} - V_{cmp} = V_{in} - V_{ref} \times \frac{\sum_j C_{vref}}{\sum C}. \quad \text{Equation (5)}$$

As can be seen from Equation (5), when comparing the common-mode voltage $V_{cm}$ with the comparison voltage $V_{cmp}$, the comparator 108 actually compares the input voltage $V_{in}$ with the voltage to be compared $$V_{ref} \times \frac{\sum_j C_{vref}}{\sum C}.$$

If the common-mode voltage $V_{cm}$ at the positive input terminal of the comparator 108 is greater than the comparison voltage $V_{cmp}$ at the negative input terminal (referring to Equation (5), that is, $$V_{ref} \times \frac{\sum_j C_{vref}}{\sum C} < V_{in} \Bigg),$$

the comparison result $D_k$ output by the comparator 108 is logic 1, and then, based on the comparison result $D_k=1$ output by the comparator 108, the SAR logic circuit 110 may take the voltage to be compared corresponding to the code during this comparison as the lower limit of the next search interval. Otherwise, if the common-mode voltage $V_{cm}$ at the positive input terminal of the comparator 108 is less than the comparison voltage $V_{cmp}$ at the negative input terminal (referring to Equation (5), that is, $$V_{ref} \times \frac{\sum_j C_{vref}}{\sum C} > V_{in} \Bigg),$$

the comparison result $D_k$ output by the comparator 108 is logic 0, and then, based on the comparison result $D_k=0$ output by the comparator 108, the SAR logic circuit 110 may take the voltage to be compared corresponding to the code during this comparison as the upper limit of the next search interval. The comparison result $D_k$ will be sent to the SAR logic circuit 110 for storage, and will serve as one bit in the output digital code $D_{out}$. It should be noted that, in the first search step, the most significant bit (MSB) of the code output by the SAR logic circuit 110 is set to 1, and the remaining bits are set to 0. In a specific example, referring to FIG. 3A, the SAR logic circuit 110 outputs the code "10000", the least significant bit (LSB) to the most significant bit of which respectively control the switches S1 to S5, such that the switch S5 is coupled to the reference voltage $V_{ref}$, and the switches S1 to S4 are coupled to the ground voltage $V_{ss}$. At this moment, $\Sigma_j C_{vref}=5C$, and $\Sigma$ C=16C. Then, the voltage to be compared $$V_{ref} \times \frac{\sum_j C_{vref}}{\sum C} = \frac{5}{16} V_{ref}, \text{ and } V_{cmp} = V_{cm} - V_{in} + \frac{5}{16} V_{ref}.$$

When the input voltage $V_{in}$ is greater than the voltage to be compared $$\frac{5}{16} V_{ref},$$

the comparison result Dx output by the comparator 108 is the logic 1; and when the input voltage $V_{in}$ is less than the voltage to be compared $$\frac{5}{16} V_{ref},$$

the comparison result $D_k$ output by the comparator 108 is the logic 0.

Figures 4A, 4B:
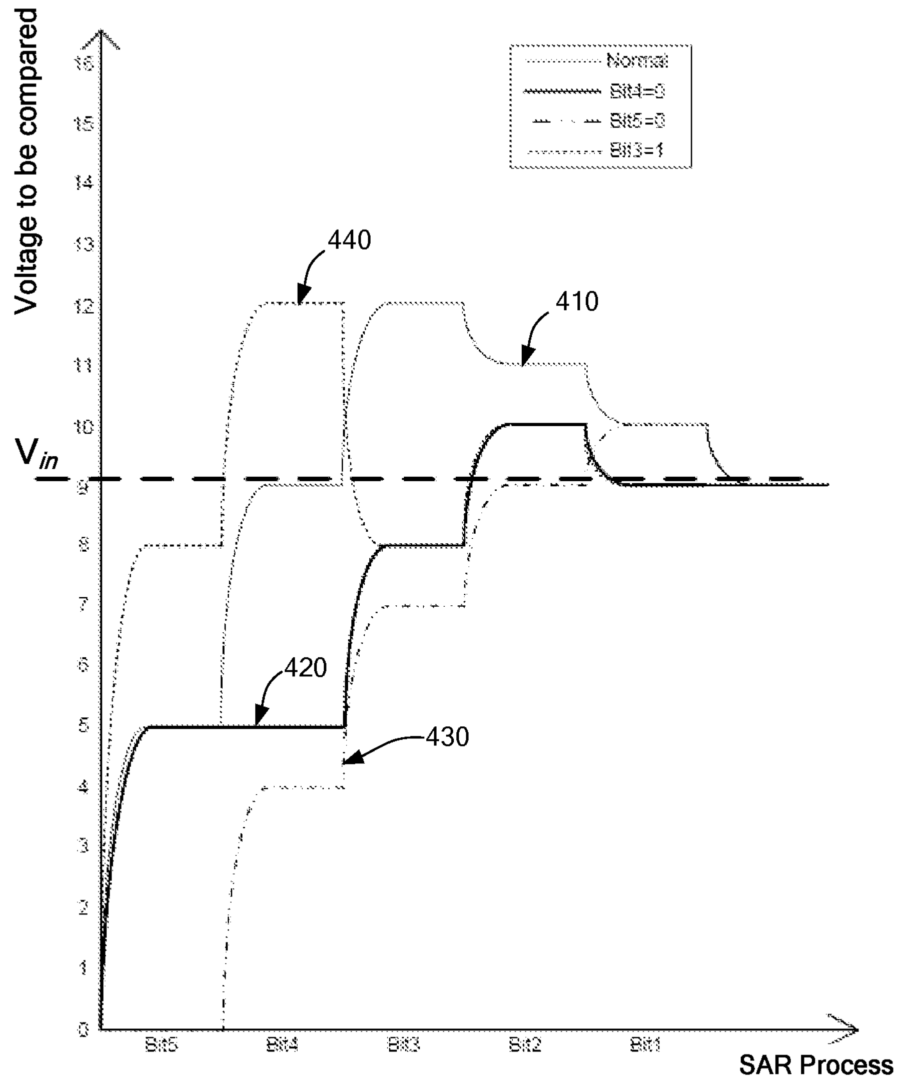
FIG. 4A illustrates input and output curves of a defect-free SAR ADC under different conditions according to an embodiment of the present application.
FIG. 4B illustrates search paths of the defect-free SAR ADC of FIG. 4A under different conditions.

The analog-to-digital conversion process of the SAR ADC 100 shown in FIGS. 2 and 3 will be described below with reference to FIGS. 4A and 4B. FIG. 4A illustrates input and output curves of the SAR ADC 100 under different conditions, and FIG. 4B illustrates search paths of the SAR ADC 100 of FIG. 4A under different conditions.

Taking the input voltage $V_{in}$ being slightly greater than $$\frac{9}{16}V_{ref}$$

as an example, the curve 410 in FIG. 4A illustrates a process for determining the output digital code $D_{out}$ from the most significant bit (MSB) $Bit_5$ to the least significant bit (LSB) Bit, in a normal operation, and the first row of the table in FIG. 4B illustrates a search path of the SAR ADC 100. Referring to both FIG. 4A and FIG. 4B, in the first step, the SAR logic circuit 110 provides a code "10000", so as to control the switch S5 to couple with the reference voltage $V_{ref}$ and control the switches S1 to S4 to couple with the ground voltage $V_{ss}$. At this moment, $$V_{cmp}=V_{cm}-V_{in}+\frac{5}{16}V_{ref}.$$

After comparison of the comparator 108, $V_{cmp}$ is less than $V_{cm}$. That is, the voltage to be compared $$\frac{5}{16}V_{ref}$$

is less than the input voltage $V_{in}$, and thus a comparison result $D_5$ output by the comparator 108 is logic 1, thereby determining that $Bit_5$ of the output digital code $D_{out}$ is 1. In the second step, based on the value of $Bit_5$, the SAR logic circuit 110 sets the value of $Bit_4$ to 1 and provides the code "11000", so as to control the switches S5 and S4 to couple with the reference voltage $V_{ref}$ and control the switches S1 to S3 to couple with the ground voltage $V_{ss}$. At this moment, $$V_{cmp}=V_{cm}-V_{in}+\frac{9}{16}V_{ref}.$$

After comparison of the comparator 108, $V_{cmp}$ is still less than $V_{cm}$. That is, the voltage to be compared $$\frac{9}{16}V_{ref}$$

is less than the input voltage $V_{in}$, and thus a comparison result $D_4$ output by the comparator 108 is logic 1, thereby determining that $Bit_4$ of the output digital code $D_{out}$ is 1. In the third step, based on the values of $Bit_5$ and $Bit_4$, the SAR logic circuit 110 sets the value of $Bit_3$ to 1 and provides the code "11100", so as to control the switches S5, S4 and S3 to couple with the reference voltage $V_{ref}$ and control the switches S1 and S2 to couple with the ground voltage $V_{ss}$. At this moment, $$V_{cmp}=V_{cm}-V_{in}+\frac{12}{16}V_{ref}.$$

After comparison of the comparator 108, $V_{cmp}$ is greater than $V_{cm}$. That is, the voltage to be compared $$\frac{12}{16}V_{ref}$$

is greater than the input voltage $V_{in}$, and thus a comparison result $D_3$ output by the comparator 108 is logic 0, thereby determining that $Bit_3$ of the output digital code $D_{out}$ is 0. In the fourth step, based on the values of $Bit_5$ to $Bit_3$, the SAR logic circuit 110 provides the code "11010", so as to control the switches S5, S4 and S2 to couple with the reference voltage $V_{ref}$ and control the switches S1 and S3 to couple with the ground voltage $V_{ss}$. At this moment, $$V_{cmp}=V_{cm}-V_{in}+\frac{11}{16}V_{ref}.$$

After comparison of the comparator 108, $V_{cmp}$ is greater than $V_{cm}$. That is, the voltage to be compared $$\frac{11}{16}V_{ref}$$

is greater that the input voltage $V_{in}$, and thus a comparison result $D_2$ output by the comparator 108 is logic 0, thereby determining that Bite of the output digital code $D_{out}$ is 0. In the fifth step, based on the values of $Bit_5$ to $Bit_2$, the SAR logic circuit 110 sets the value of $Bit_1$ to 1 and provides the code "11001", so as to control the switches S5, S4 and S1 to couple with the reference voltage $V_{ref}$ and control the switches S2 and S3 to couple with the ground voltage $V_{ss}$. At this moment, $$V_{cmp}=V_{cm}-V_{in}+\frac{10}{16}V_{ref}.$$

After comparison of the comparator 108, $V_{cmp}$ is still greater than $V_{cm}$. That is, the voltage to be compared $$\frac{10}{16}V_{ref}$$

is greater than the input voltage $V_{in}$, and thus a comparison result $D_1$ output by the comparator 108 is logic 0, thereby determining that $Bit_1$ of the output digital code $D_{out}$ is 0. At this point, the value of each bit of the output digital code $D_{out}$ has been determined. The SAR ADC 100 outputs the conversion result "11000". After a weighting operation, it is 5×1+4×1+3×0+2×0+1×0=9, which means the input voltage $$V_{in}\approx\frac{9}{16}V_{ref}.$$

For the SAR ADC based on the redundant coding scheme, there may be overlapping windows between some the search intervals. During the conversion process, an error caused by a previous wrong code may be compensated by subsequent codes. Continuing referring to the SAR ADC 100 shown in FIG. 2 and FIGS. 3A and 3B, a weight $W_k$ of the $k^{th}$ bit of the output digital code $D_{out}$ corresponds to the capacitance of the corresponding one of the five capacitors C1 to C5 in the capacitor array 102. That is, $W_5=5$. $W_4=4$, $W_3=3$, $W_2=2$, and $W_1=1$. It can be seen that the above weights follow the aforementioned Equation (2) and Equation (3), which means that the SAR ADC 100 includes a redundant capacitor array and has a redundant window. Thus, the SAR ADC 100 may have multiple solutions (i.e., multiple output digital codes $D_{out}$) for some specific input voltage $V_{in}$. For different search paths or different encoding sequences, these solutions can give the same conversion value.

Referring to the curve 420 shown in FIG. 4A and the search path in the second row of the table shown in FIG. 4B, in a case where the input voltage $V_{in}$ is slightly greater than $$\frac{9}{16}V_{ref}$$

and Bit of the output digital code $D_{out}$ is forced to be 0, the SAR ADC 100 finally outputs the digital code "10101" after going through the search path "10000"→"10000"→"10100"→"10110"→"10101". Similarly, referring to curve 430 shown in FIG. 4A and the search path in the third row of the table shown in FIG. 4B, in a case where the input voltage $V_{in}$ is slightly greater than $$\frac{9}{16}V_{ref}$$

and $Bit_5$ of the output digital code $D_{out}$ is forced to be 0, the SA ADC 100 finally outputs the digital code "01110" after going through the search path "00000"→"01000"→"01100"→"01110"→"01111". Referring to curve 440 shown in FIG. 4A and the search path in the fourth row of the table shown in FIG. 4B, in a case where the input voltage $V_{in}$ is slightly greater than $$\frac{9}{16}V_{ref}$$

and $Bit_3$ of the output digital code $D_{out}$ is forced to be 1, the SAR ADC 100 finally outputs the digital code "10101" after going through the search path "10100"→"11100"→"10100"→"10110"→"10101". Based on the above Equation (1), it can be determined that all of the digital codes "11000", "10101" and "01110" can represent the value 9, which corresponds to the magnitude of the input voltage $V_{in}$.

Based on the above discussion, it can be seen that, in a case where the SAR ADC 100 operates normally, the SAR ADC 100 can output the correct digital code $D_{out}$, even if $Bit_4$ is forced to be 0, $Bit_5$ is forced to be 0, or $Bit_3$ is forced to be 1. When there is a defect in the SAR ADC 100, different outputs of the SAR ADC 100 under different search paths will be discussed below in conjunction with FIGS. 5A and 5B to FIGS. 9A and 9B, so as to clarify the principle for detecting the defect in the SAR ADC 100.

Figure 5A:
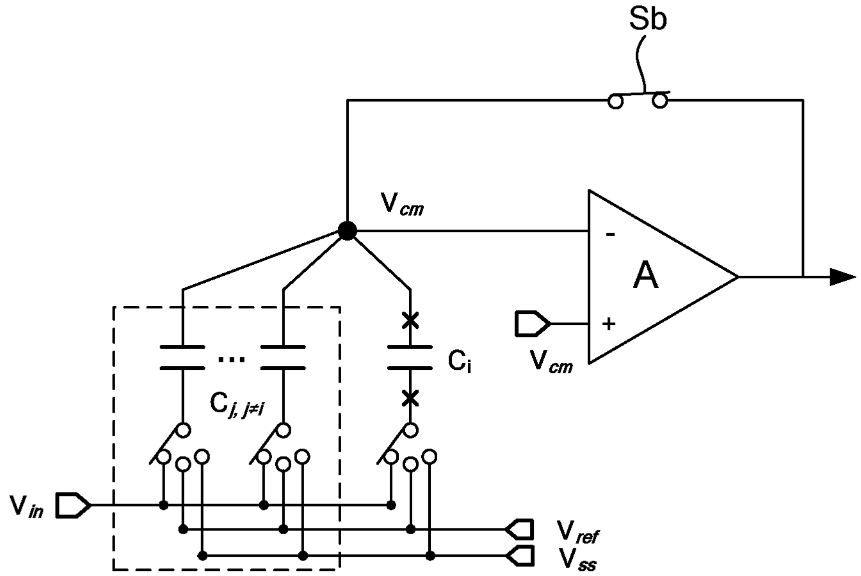
FIG. 5A is a schematic diagram of the SAR ADC operating in the sampling phase when a capacitor in the SAR ADC is open-circuited.
Figure 5B:
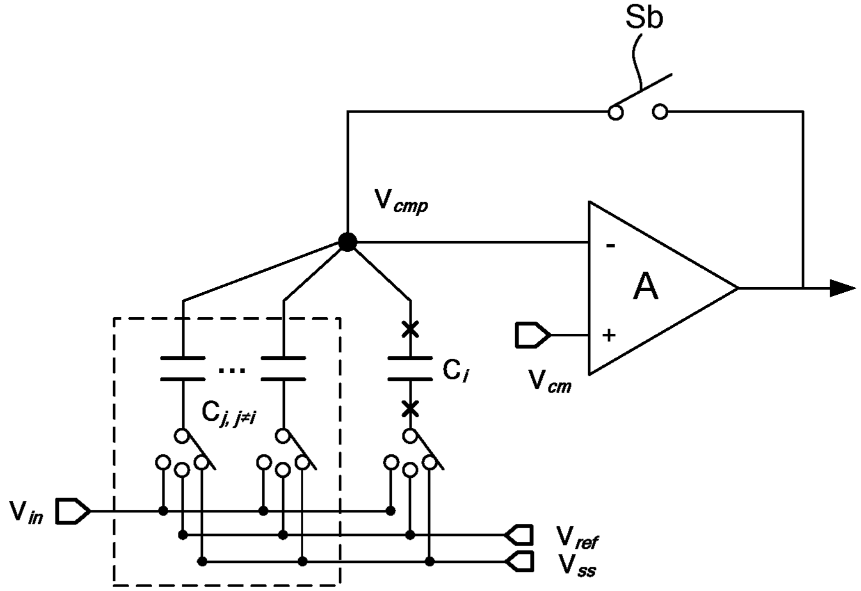
FIG. 5B is a schematic diagram of the SAR ADC operating in the conversion phase when a capacitor in the SAR ADC is open-circuited.

Referring to FIG. 5A and FIG. 5B, an exemplary circuit diagram of a SAR ADC, in which one capacitor $C_k$ in the capacitor array is open-circuited and other capacitors $C_{j,\, j\neq l}$ operate normally, is illustrated. FIG. 5A is a schematic diagram of the SAR ADC operating in a sampling phase. Since the capacitor $C_k$ is open-circuited, the capacitor $C_k$ cannot be charged during the sampling phase. FIG. 5B is a schematic diagram of the SAR ADC operating in the conversion phase. Since the capacitor $C_k$ is open-circuited, the comparison voltage $V_{cmp}$ at the negative input terminal of the comparator can be expressed by the following Equation (6):

$$V_{cmp} = V_{cm} - V_{in} + V_{ref} * \frac{\sum_{j\neq k} C_{vref}}{\sum C - C_k}; \quad \text{Equation (6)}$$

wherein $\Sigma$ $C-C_k$ represents a sum of capacitances of all capacitors in the capacitor array except for the capacitor $C_k$, and $\Sigma_{j\neq k}$ $C_{vref}$ represents a sum of capacitances of all capacitors in the capacitor array that are coupled with the reference voltage $V_{ref}$ except for the capacitor $C_k$. Comparing Equation (6) with Equation (4), it can be seen that, due to the open circuit of the capacitor $C_k$, the comparison voltage $V_{cmp}$ at the negative input terminal of the comparator during the conversion process of the SAR ADC would not equal to that of a defect-free state, resulting in an incorrect result.

Figures 6A, 6B:
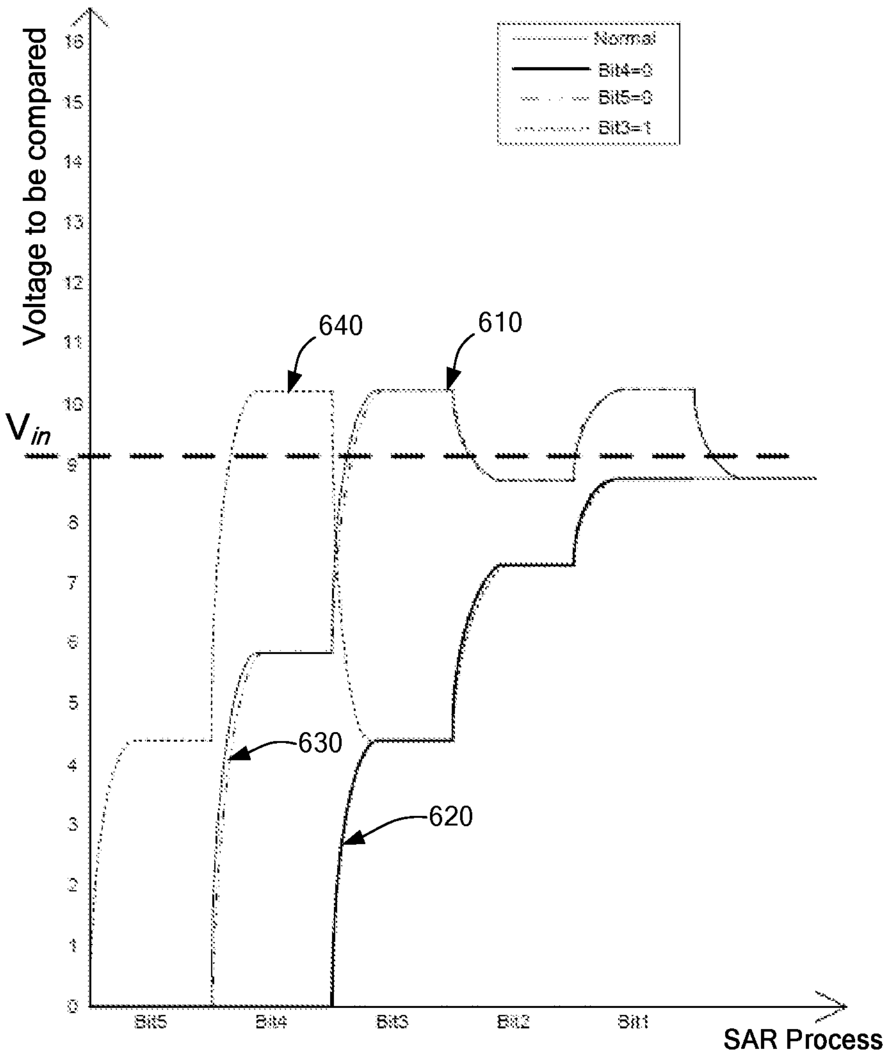
FIG. 6A illustrates input and output curves of an SAR ADC with an open-circuited capacitor under different conditions according to an embodiment of the present application.
FIG. 6B illustrates search paths of the SAR ADC with the open-circuited capacitor of FIG. 6A under different conditions.

Taking the capacitor C5 being open-circuited in the capacitor array 102 of the SAR ADC 100 shown in FIGS. 3A and 3B as an example, FIG. 6A and FIG. 6B illustrate a conversion process of the SAR ADC 100. FIG. 6A illustrates input and output curves of the SAR ADC 100 under different conditions, and FIG. 6B illustrates search paths of the SAR ADC 100 of FIG. 6A under different conditions. Continuing to take the input voltage $V_{in}$ being slightly greater than $$\frac{9}{16}V_{ref}$$

as an example, the curve 610 in FIG. 6A and the search path in the first row of the table in FIG. 6B illustrate a process for determining the output digital code $D_{out}$ from MSB to LSB in a normal operation. The SAR ADC 100 finally outputs the digital code "11010" after going through the search path "10000"→"11000"→"11100"→"11010"→"11011". The curve 620 in FIG. 6A and the search path in the second row of the table in FIG. 6B illustrate a case where $Bit_4$ of the output digital code $D_{out}$ is forced to be 0. The SAR ADC 100 finally outputs the digital code "10111" after going through the search path "10000"→"10000"→"10100"→"10110"→"10111". The curve 630 in FIG. 6A and the search path in the third row of the table in FIG. 6B illustrate a case where $Bit_5$ of the output digital code $D_{out}$ is forced to be 0. The SAR ADC 100 finally outputs the digital code "01010" after going through the search path "00000"→"01000"→"01100"→"01010"→"01011". The curve 640 in FIG. 6A and the search path in the fourth row of the table in FIG. 6B illustrate a case where $Bit_3$ of the output digital code $D_{out}$ is forced to be 1. The SAR ADC 100 finally outputs the digital code "10111" after going through the search path "10100"→"11000"→"10100"→"10110"→"10111".

In the above example, although a defect occurs inside the SAR ADC 100 (i.e., the capacitor is open-circuited) and the defect is not known from outside of the circuit at this moment, it is still believed that the digital code $D_{out}$ output by the SAR ADC 100 is reliable, and the results of the conversion are calculated based on Equation (1). However, according to the above Equation (1), it can be determined that the digital codes "11010", "10111", "01010" and "10111" output under the above four different search paths represent the values "11", "11" and "6" and "11" respectively, and none of them can accurately represent the magnitude of the input voltage $V_{in}$.

Figure 7A:
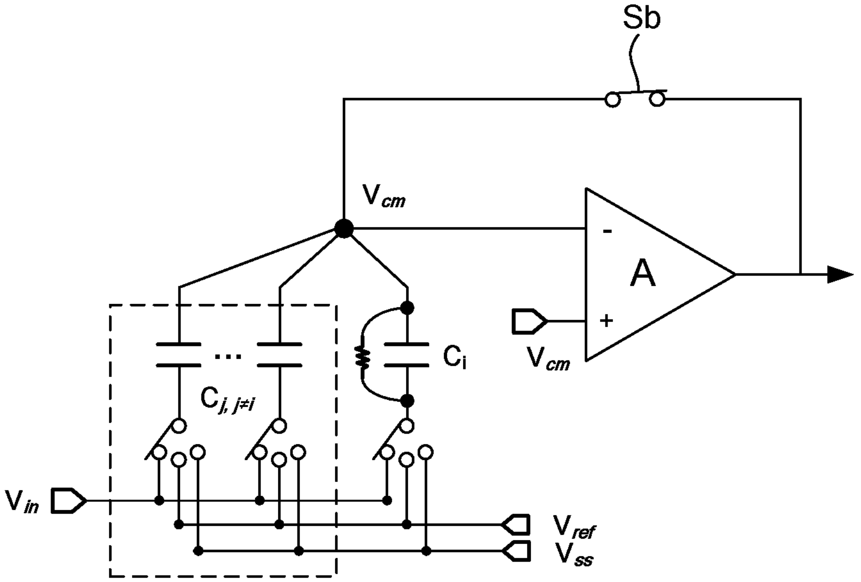
FIG. 7A is a schematic diagram of the SAR ADC operating in the sampling phase when the capacitor in the SAR ADC is short-circuited.
Figure 7B:
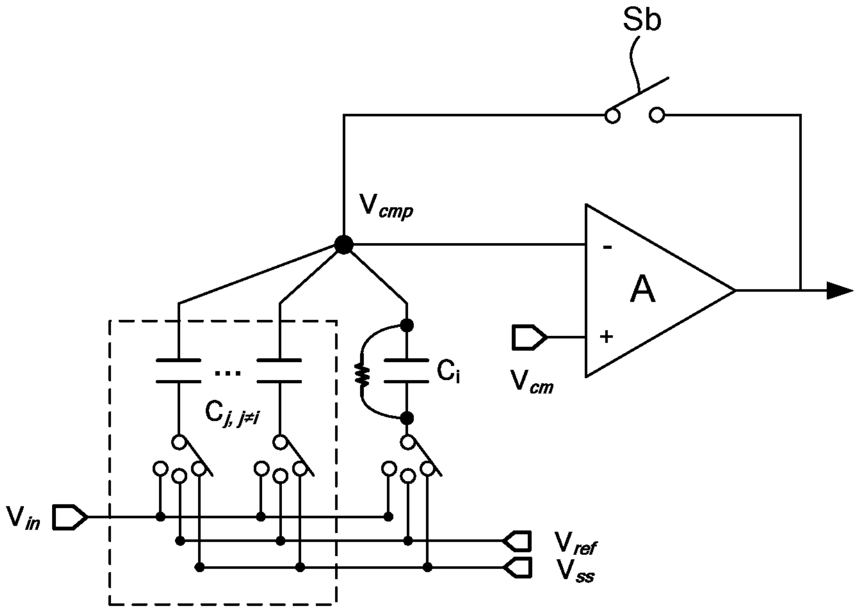
FIG. 7B is a schematic diagram of the SAR ADC operating in the conversion phase when the capacitor in the SAR ADC is short-circuited.

Referring to FIG. 7A and FIG. 7B, an exemplary circuit diagram of an SAR ADC, in which one capacitor $C_k$ in the capacitor array is short-circuited and other capacitors $C_{j,\, j\neq k}$ operate normally, is illustrated. FIG. 7A is a schematic diagram of the SAR ADC operating in a sampling phase. Since the capacitor $C_k$ is short-circuited, it seems that the input voltage $V_{in}$ is connected to the negative input terminal of the comparator through an equivalent resistor. FIG. 7B is a schematic diagram of the SAR ADC operating in the conversion phase. Similarly, since the capacitor $C_k$ is short-circuited, the comparison voltage $V_{cmp}$ at the negative input terminal of the comparator can be expressed by the following Equation (7):

$$V_{cmp} = SAR_k \times V_{ref}; \qquad \text{Equation (7)}$$

wherein SAR represents a bit corresponding to the capacitor $C_k$ in the code provided by the SAR logic circuit. Comparing Equation (7) with Equation (4), it can be seen that, due to the short circuit of the capacitor $C_k$, the comparison voltage $V_{cmp}$ at the negative input terminal of the comparator during the conversion process of the SAR ADC would not equal to that of a defect-free state, resulting in an incorrect result.

Figures 8A, 8B:
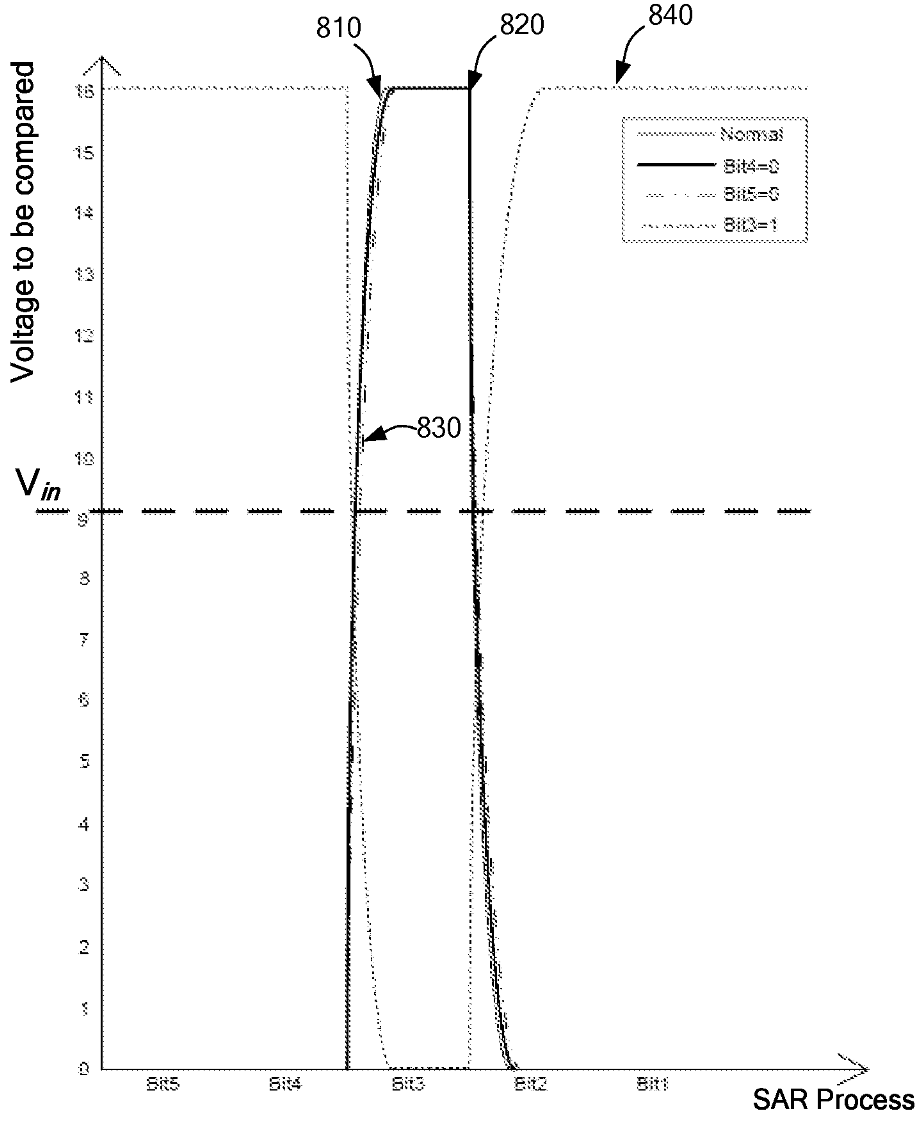
FIG. 8A illustrates input and output curves of an SAR ADC with a short-circuited capacitor under different conditions according to an embodiment of the present application.
FIG. 8B illustrates search paths of the SAR ADC with the short-circuited capacitor of FIG. 8A under different conditions.

Taking the capacitor C3 being short-circuited in the capacitor array 102 of the SAR ADC 100 shown in FIGS. 3A and 3B as an example, FIG. 8A and FIG. 8B illustrate a conversion process of the SAR ADC 100. FIG. 8A illustrates input and output curves of the SAR ADC 100 under different conditions, and FIG. 8B illustrates search paths of the SAR ADC 100 of FIG. 8A under different conditions. Continuing to take the input voltage $V_{in}$ being slightly greater than $$\frac{9}{16}V_{ref}$$

as an example, the curve 810 in FIG. 8A and the search path in the first row of the table in FIG. 8B illustrate a process for determining the output digital code $D_{out}$ from MSB to LSB in a normal operation. The SAR ADC 100 finally outputs the digital code "11011" after going through the search path "10000"→"11000"→"11000"→"11010"→"11011". The curve 820 in FIG. 8A and the search path in the second row of the table in FIG. 8B illustrate a case where $Bit_4$ of the output digital code $D_{out}$ is forced to be 0. The SAR ADC 100 finally outputs the digital code "10011" after going through the search path "10000"→"10000"→"10100"→"10010"→"10011". The curve 830 in FIG. 8A and the search path in the third row of the table in FIG. 8B illustrate a case where $Bit_5$ of the output digital code $D_{out}$ is forced to be 0. The SAR ADC 100 finally outputs the digital code "01011" after going through the search path "00000"→"01000"→"01100"→"01010"→"01011". The curve 840 in FIG. 8A and the search path in the fourth row of the table in FIG. 8B illustrate a case where $Bit_3$ of the output digital code $D_{out}$ is forced to be 1. The SAR ADC 100 finally outputs the digital code "00100" after going through the search path "10100"→"01100"→"00100"→"00110"→"00101", the digital code "00100" is finally output.

Similarly, when the internal defect (i.e., the capacitor is short-circuited) of the SAR ADC 100 is not known from outside of the circuit, the above Equation (1) is still used to calculate the conversion results. It can be determined that the digital codes "11011", "10011", "01011" and "00100" output under the above four different search paths represent the values "12", "8", "7" and "3" respectively, and none of them can accurately represent the magnitude of the input voltage $V_{in}$.

In addition, in some circuit designs, a certain capacitor in the SAR ADC may include a plurality of standard capacitors. When a defect (for example, short circuit or open circuit) occurs in one or more of the standard capacitors, the capacitance of this certain capacitor in the SAR ADC may be inaccurate, thus affecting the accuracy of the SAR ADC. For example, the capacitance of capacitor C3 in the capacitor array 102 of the SAR ADC 100 shown in FIGS. 3A and 3B is 3C under normal circumstances, but due to manufacturing defects, the capacitance may be only 2C.

Figures 9A, 9B:
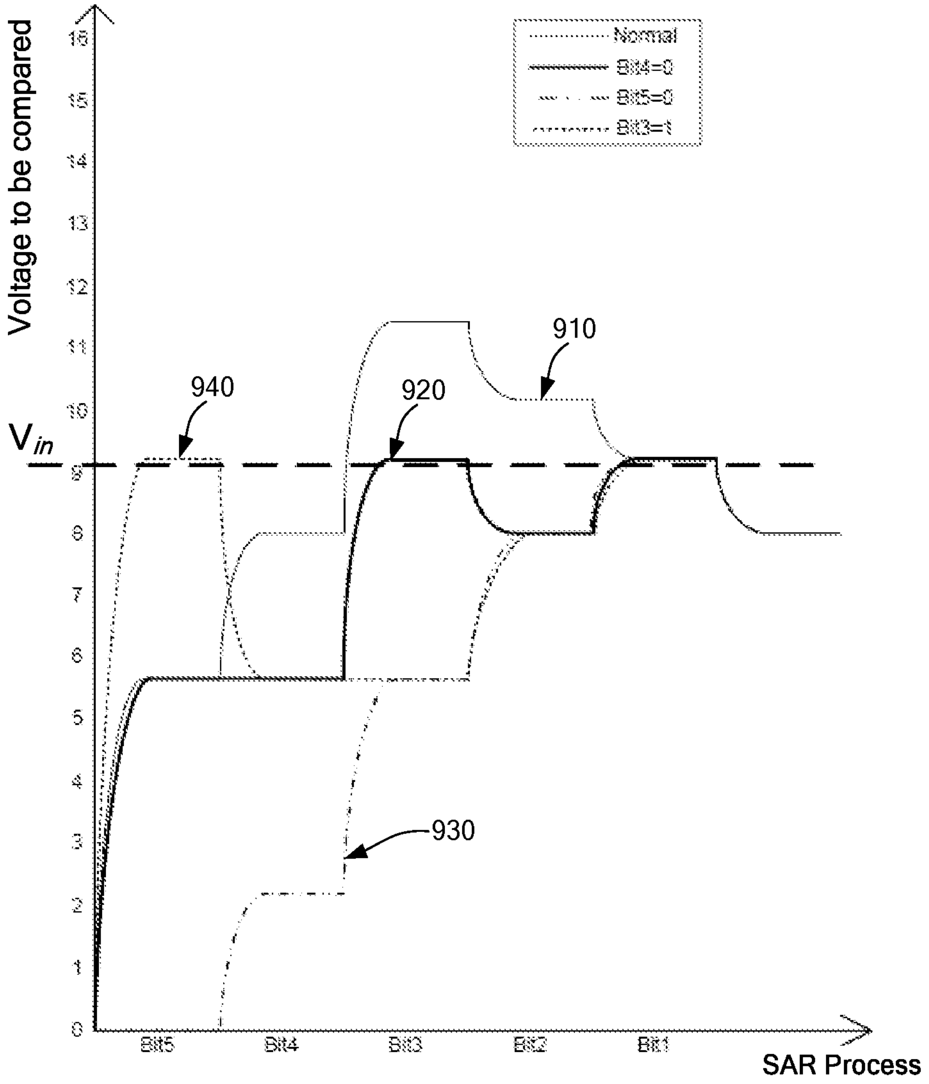
FIG. 9A illustrates input and output curves of an SAR ADC having a capacitor with an inaccurate capacitance under different conditions according to an embodiment of the present application.
FIG. 9B illustrates search paths of the SAR ADC having a capacitor with an inaccurate capacitance of FIG. 9A under different conditions.

Taking the capacitance of the capacitor C4 in the capacitor array 102 of the SAR ADC 100 shown in FIGS. 3A and 3B being 2C because of a defect as an example, FIG. 9A and FIG. 9B illustrate a conversion process of the SAR ADC 100. FIG. 9A illustrates input and output curves of the SAR ADC 100 under different conditions, and FIG. 9B illustrates search path of the SAR ADC 100 of FIG. 9A under different conditions. Continuing to take the input voltage $V_{in}$ being slightly greater than $$\frac{9}{16}V_{ref}$$

as an example, the curve 910 in FIG. 9A and the search path in the first row of the table in FIG. 9B illustrate a process for determining the output digital code $D_{out}$ from MSB to LSB in a normal operation. The SAR ADC 100 finally outputs the digital code "11000" after going through the search path "10000"→"11000"→"11100"→"11010"→"11001". The curve 920 in FIG. 9A and the search path in the second row of the table in FIG. 9B illustrate a case where $Bit_4$ of the output digital code $D_{out}$ is forced to be 0. The SAR ADC 100 finally outputs the digital code "10010" after going through the search path "10000"→"10000"→"10100"→"10010"→"10011". The curve 930 in FIG. 9A and the search path in the third row of the table in FIG. 9B illustrate a case where $Bit_5$ of the output digital code $D_{out}$ is forced to be 0. The SAR ADC 100 finally outputs the digital code "01110" after going through the search path "00000"→"01000"→"01100"→"01110"→"01111". The curve 940 in FIG. 9A and the search path in the fourth row of the table in FIG. 9B illustrate a case where $Bit_3$ of the output digital code $D_{out}$ is forced to be 1. The SAR ADC 100 finally outputs the digital code "01110" after going through the search path "10100"→"01100"→"01100"→"01110"→"01111".

Similarly, when the internal defect (i.e., the inaccurate capacitance) of the SAR ADC 100 is not known from outside of the circuit, the above Equation (1) is still used to calculate the conversion results. It can be determined that the digital codes "11000", "10010", "01110" and "01110" output under the above four different search paths represent the values "9", "7", "9" and "9" respectively, and some of them can accurately represent the magnitude of the input voltage $V_{in}$.

In summary, compared with the normal operation of the SAR ADC 100 shown in FIGS. 4A and 4B, none of the SAR ADC 100 having an open-circuited capacitor as shown in FIGS. 6A and 6B, the SAR ADC 100 having a short-circuited capacitor as shown in FIGS. 8A and 8B, and the SAR ADC 100 having a capacitor with inaccurate capacitance as shown in FIGS. 9A and 9B can output the correct digital codes $D_{out}$ under multiple search paths. Based on the above discussion, for a specific input voltage $V_{in}$ corresponding to multiple digital codes, if we strategically or intentionally change the search paths based on these multiple digital codes, the outputs of the SAR ADC 100 should remain unchanged when there is no defect in the SAR ADC 100, and the outputs of the SAR ADC 100 cannot accurately represent the magnitude of the input voltage $V_{in}$ when there is a defect in the SAR ADC 100. That is the basic principle of the technical solution described in this application for defecting a defect in the SAR ADC 100.

Referring back to FIG. 1, the test circuit 200 of the present application includes an inputting unit 210, a controlling unit 220 and a determining unit 230, and is configured for detecting a defect in the SAR ADC 100.

The inputting unit 210 is configured to input a defect-sensitive voltage into the SAR ADC 100. Continuing to take the output digital code $D_{out}$ of the SAR ADC 100 being represented by a K-bit binary number as an example. The defect-sensitive voltage may refer to an input voltage $V_{in}$ having a magnitude which can be represented by a plurality of K-bit binary numbers (also referred as a K-bit digital code) after conversion by the SAR ADC 100.

Figure 10A:
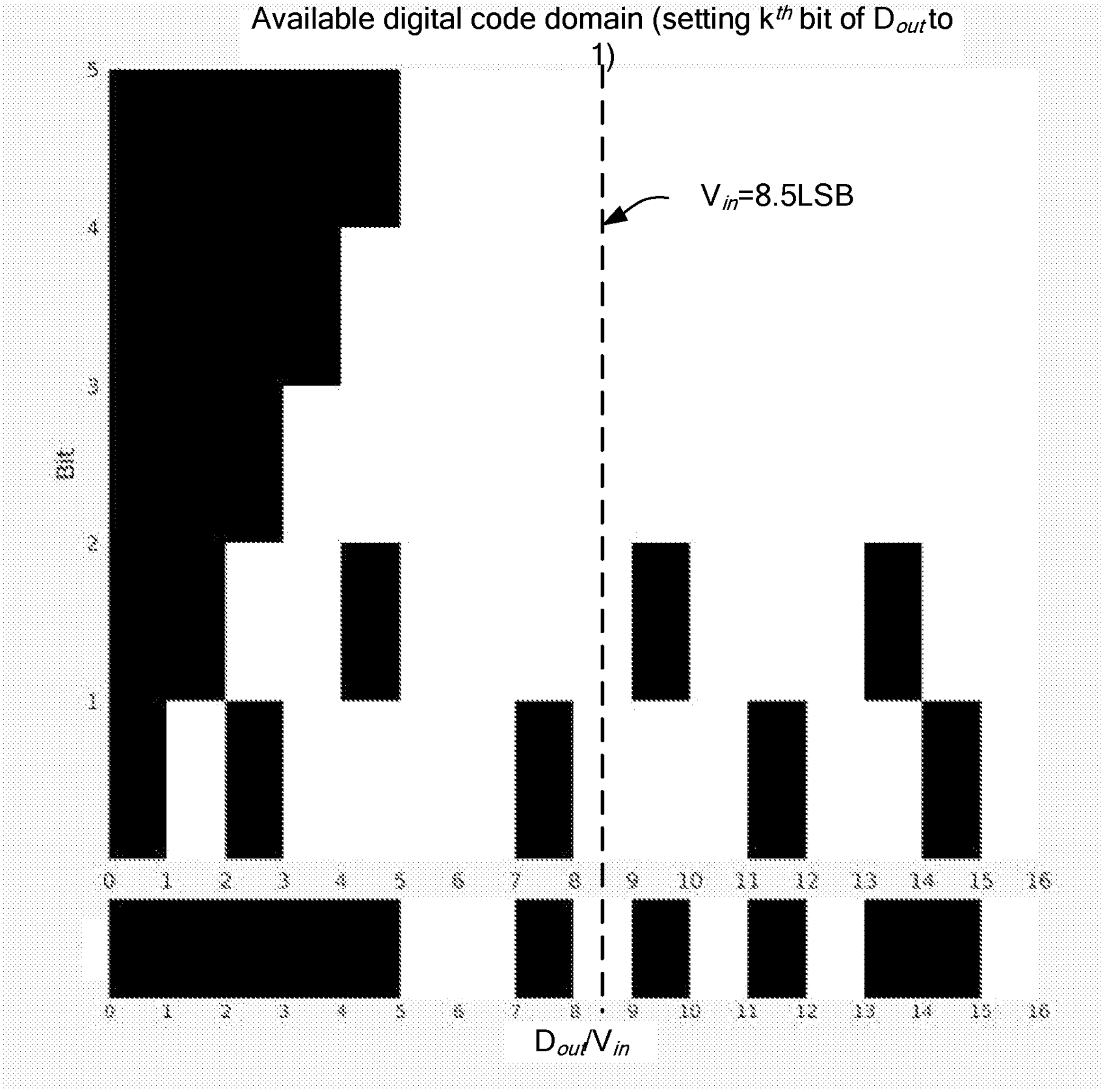
FIG. 10A illustrates a digital code diagram when each bit of an output digital code of the SAR ADC is set to 1 according to an embodiment of the present application.
Figure 10B:
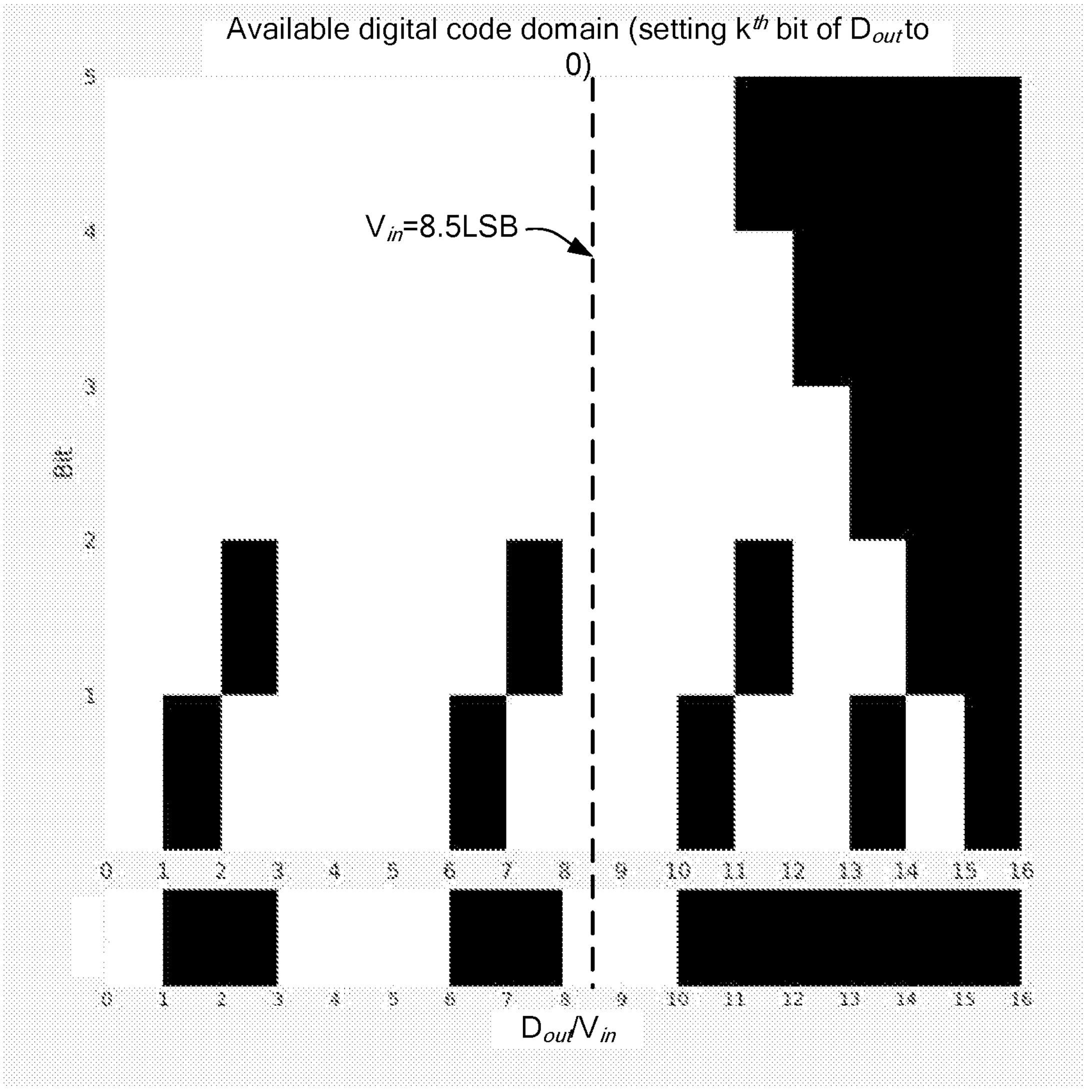
FIG. 10B illustrates a digital code diagram when each bit of an output digital code of the SAR ADC is set to 0 according to an embodiment of the present application.

Referring to FIG. 10A and FIG. 10B, digital code diagrams corresponding to the SAR ADC 100 shown in FIG. 2 are illustrated. The horizontal axis represents quantization intervals from 0 to 15 corresponding to the input voltage $V_{in}$, and the vertical axis represents each bit of the output digital code $D_{out}$ When K is 5 (i.e., $Bit_1$ to $Bit_5$). For any input voltage $V_{in}$ in the quantization intervals, the $k^{th}$ bit (any bit from $1^{st}$ to $K^{th}$) in the K-bit digital code is set to 1 (or 0) before performing the successive approximation conversion on the input voltage $V_{in}$, and then the input voltage $V_{in}$ is converted to obtain the other bits except the $k^{th}$ bit in the K-bit digital code. If the final K-bit digital code can correctly represent the input voltage $V_{in}$, it can be determined that the $k^{th}$ bit is a sensitive bit. In other words, the input voltage $V_{in}$ is sensitive to the $k^{th}$ bit, and this input voltage $V_{in}$ is a defect-sensitive voltage.

The white area in FIG. 10A indicates that, after setting a certain bit of $Bit_1$ to $Bit_5$ to 1, there is a K-bit digital code in the digital code domain that can represent the corresponding input voltage $V_{in}$, and the black area indicates that, after setting a certain bit of $Bit_1$ to $Bit_5$ to 1, there is no digital code in the digital code domain that can represent the corresponding input voltage $V_{in}$. For example, for an input voltage corresponding to the quantization interval 0 to 1, there is no K-bit digital code that can correctly represent the input voltage $V_{in}$ if setting any bit of $Bit_1$ to $Bit_5$ to 1. In other words, the input voltage $V_{in}$ corresponding to the quantization interval 0 to 1 is not a defect-sensitive voltage. For an input voltage corresponding to the quantization interval 1 to 2, $Bit_1$ is a sensitive bit. When $Bit_1$ is set to 1, one K-bit digital code can be obtained through a successive approximation conversion to correctly represent the input voltage $V_{in}$. However, when other bits are set to 1, there is no K-bit digital code that can correctly represent the input voltage $V_{in}$. For an input voltage corresponding to the quantization interval 3 to 4, $Bit_1$ to $Bit_5$ are sensitive bits. When $Bit_1$ to $Bit_3$ are set to 1 respectively, three K-bit digital codes can be obtained to correctly represent the input voltage $V_{in}$. For an input voltage corresponding to the quantization interval 8 to 9, any one of $Bit_1$ to $Bit_5$ is a sensitive bit. When $Bit_1$ to $Bit_5$ are set to 1 respectively, five K-bit digital codes can be obtained to correctly represent the input voltage. Taking the input voltage $V_{in}$ being equal to 8.5LSB (i.e., $$\frac{8.5}{16}V_{ref})$$

as an example, no matter which bit of $Bit_1$ to $Bit_5$ in its output digital code $D_{out}$ is set to 1, there is a digital code in the digital code domain to correctly represent the input voltage $V_{in}$ of 8.5LSB. In other words, the input voltages $V_{in}$ corresponding to the quantization interval 1 to 2, the quantization interval 3 to 4 and the quantization interval 8 to 9 described in the above examples are all defect-sensitive voltage. However, for the input voltage corresponding to the quantization interval 1 to 2, because there is only one K-bit digital code that can correctly represent the input voltage, a defect in the circuit cannot be accurately detected based on this K-bit digital code. In order to improve the accuracy and efficiency of defect detection, in embodiments of the present application, it is preferred to select an input voltage that can be represented by multiple K-bit digital codes as the defect-sensitive voltage input into the SAR ADC 100, such as the input voltages corresponding to the quantization interval 3 to 4 and the quantization interval 8 to 9. In a practical application, in order to further improve the detection efficiency, the input voltage having K sensitive bits may be selected, for example, the input voltage corresponding to the quantization interval 8 to 9. In an area under the horizontal axis in FIG. 10A, the white blocks indicate defect-sensitive input values having K sensitive bits. These defect-sensitive input values are the input voltages corresponding to the quantization intervals 5 to 7, 8 to 9, 10 to 11, 12 to 13 and 15 to 16.

Similarly, referring to FIG. 10B, the white area indicates that, after setting a certain bit of $Bit_1$ to $Bit_5$ to 0, there is a digital code in the digital code domain that can represent the corresponding input voltage $V_{in}$, and the black area indicates that, after setting a certain bit of $Bit_1$ to $Bit_5$ to 0, there is no digital code in the digital code domain that can represent the corresponding input voltage $V_{in}$. Continuing to take the input voltage $V_{in}$ being equal to 8.5LSB as an example, no matter which bit of $Bit_1$ to $Bit_5$ in its output digital code $D_{out}$ is set to 0, there is a digital code in the digital code domain that can represent the input voltage $V_{in}$ of 8.5LSB. In an area under the horizontal axis in FIG. 10B, the white blocks indicate defect-sensitive input values having K sensitive bits. These defect-sensitive input values are the input voltages corresponding to the quantization intervals 0 to 1, 3 to 6, and 8 to 10.

Referring both FIG. 10A and FIG. 10B, in a case where the input voltage $V_{in}$ equals to 8.5LSB and the SAR ADC 100 has no defect, Table 1 below shows the value of each bit of the output digital code $D_{out}$ and its numerical value when each of $Bit_1$ to $Bit_5$ in the output digital code $D_{out}$ is set to 1 or 0.

TABLE 1

Conversion results when $V_{in}$ equals to 8.5LSB and the SAR ADC has no defect

| | $Bit_5$ ($W_5$ = 5) | $Bit_4$ ($W_4$ = 4) | $Bit_3$ ($W_3$ = 3) | $Bit_2$ ($W_2$ = 2) | $Bit_1$ ($W_1$ = 1) | Value of $D_{out}$ |
|---|---|---|---|---|---|---|
| $Bit_5$ is set to 1 | 1 | 0 | 1 | 0 | 0 | 8 |
| $Bit_4$ is set to 1 | 0 | 1 | 1 | 0 | 1 | 8 |
| $Bit_3$ is set to 1 | 1 | 0 | 1 | 0 | 0 | 8 |
| $Bit_2$ is set to 1 | 1 | 0 | 0 | 1 | 1 | 8 |
| $Bit_1$ is set to 1 | 1 | 0 | 0 | 1 | 1 | 8 |
| $Bit_5$ is set to 0 | 0 | 1 | 1 | 0 | 1 | 8 |
| $Bit_4$ is set to 0 | 1 | 0 | 1 | 0 | 0 | 8 |
| $Bit_3$ is set to 0 | 1 | 0 | 0 | 1 | 1 | 8 |
| $Bit_2$ is set to 0 | 1 | 0 | 1 | 0 | 0 | 8 |
| $Bit_1$ is set to 0 | 1 | 0 | 1 | 0 | 0 | 8 |

The defect-sensitive voltage can be determined during designing the circuit. For example, in some embodiments, during designing the circuit and after determining a weight of each bit in the K-bit digital code, a behavioral model can be established for the SAR ADC 100 according to the above Equation (4). The successive approximation conversion operation may be performed by using the default configuration (that is, no addition operation is performed on the digital code) and setting the $k^{th}$ bit of the K-bit digital code corresponding to the input voltage to 1 (or 0). The output of using the default configuration may be compared with the output of setting the $k^{th}$ bit of the K-bit digital code to 1 (or 0). If the two are consistent, it means that the input voltage is sensitive to the $k^{th}$ bit. That is, that is, the input voltage is a defect-sensitive voltage. All defect-sensitive voltages can be obtained by traversing the entire input range using the above method. In a practical application, the defect-sensitive voltages can be determined manually or with computer assistance. For each specific design, a specific set of defect-sensitive voltages can be obtained.

After being determined, the defect-sensitive voltage can be input into the SAR ADC 100 by the inputting unit 210. The controlling unit 220 is configured to control the SAR ADC 100 to perform an analog-to-digital conversion on the defect-sensitive voltage received from the inputting unit 210.

Specifically, the controlling unit 220 controlling the SAR ADC 100 may include step (a): setting a $k^{th}$ bit in one of the plurality of K-bit binary numbers output by the SAR ADC 100 to a fixed value, where $1 \le k \le K$.

In some embodiments, the controlling unit 220 may set the $k^{th}$ bit in the K-bit binary number output by the SAR ADC 100 to 1. In other embodiments, the controlling unit 220 may set the $k^{th}$ bit in the K-bit binary number output by the SAR ADC 100 to 0.

In some embodiments, as shown in FIG. 1, the controlling unit 220 may include a setting circuit 222. The setting circuit 222 is configured to generate a rewriting signal SAR_ow<k> for setting the $k^{th}$ bit in the K-bit binary number to a fixed value based on a setting trigger signal Set<k>, a polarity signal Polarity<k>, and an initial value signal SAR<k>. The setting trigger signal Set<k> indicates that the $k^{th}$ bit in the K-bit binary number is to be reset, the polarity signal Polarity<k> indicates that the $k^{th}$ bit in the K-bit binary number is set to 0 or 1, and the initial value signal SAR<k> indicates an initial value of the $k^{th}$ bit of a code provided by the SAR logic circuit 110 of the SAR ADC 100.

Figure 11:
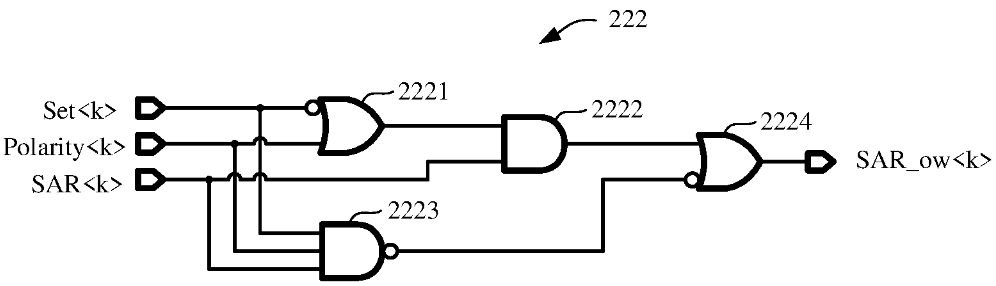
FIG. 11 illustrates a schematic diagram of a setting circuit in a test circuit according to an embodiment of the present application.

Referring to FIG. 11, a structure diagram of the setting circuit 222 is illustrated according to a specific example. The setting circuit 222 includes an OR gate 2221, an AND gate 2222, a NAND gate 2223, and an OR gate 2224. The first input terminal of the OR gate 2221 receives the inverted setting trigger signal Set<k>, the second input terminal of the OR gate 2221 receives the polarity signal Polarity<k>, and the output terminal of the OR gate 2221 is coupled to the first input terminal of the AND gate 2222. The first input terminal of the AND gate 2222 receives the output of the OR gate 2221, the second input terminal of the AND gate 2222 receives the initial value signal SAR<k>, and the output terminal of the AND gate 2222 is coupled to the first input terminal of the OR gate 2224. The three input terminals of the NAND gate 2223 receive the trigger signal Set<k>, the polarity signal Polarity<k> and the initial value signal SAR<k> respectively. The signal at the output terminal of the NAND gate 2223 is inverted and then coupled to the second input terminal of the OR gate 2224. The OR gate 2224 performs an OR operation on the output of the AND gate 2222 and the inverted signal received from the NAND gate 2223 to output the rewriting signal SAR_ow<k>, and then provides the rewriting signal SAR_ow<k> to the SAR ADC 100 for setting the $k^{th}$ bit in the K-bit binary number output by the SAR ADC 100 to 0. It can be understood that the specific implementation of the setting circuit 222 is not limited to the example of FIG. 11, and other structures and configurations can also be used in other embodiments. The setting circuit 22 can also be designed to set the $k^{th}$ bit in the K-bit binary number output by the SAR ADC 100 to 1.

Continuing to take the SAR ADC 100 shown in FIG. 2, FIG. 3A and FIG. 3B as an example, the SAR ADC 100 can convert a defect-sensitive voltage (for example, 8.5LSB) into a digital code $D_{out}$ represented by a 5-bit binary number. When executing step (a), the controlling unit 220 may set the $5^{th}$ bit (i.e., $Bit_5$) of the 5-bit binary number output by the SAR ADC 100 to 1.

The controlling unit 220 controlling the SAR ADC 100 may further include step (b): controlling the SAR ADC 100 to perform a successive approximation conversion on the defect-sensitive voltage to determine values of other bits except the $k^{th}$ bit in the K-bit binary number, thereby generating an output digital code $D_{out}(k)$.

Continuing to take the SAR ADC 100 shown in FIG. 2, FIG. 3A and FIG. 3B as an example, when executing step (b), the controlling unit 220 controls the SAR ADC 100 to perform a successive approximation conversion on the defect-sensitive voltage 8.5LSB to determine values of the other bits except $Bit_5$ in the 5-bit binary number (i.e., $Bit_4$, $Bit_3$, $Bit_2$, and $Bit_1$). According to Table 1, when operating normally, the SAR ADC 100 can determine that the values of $Bit_4$, $Bit_3$, $Bit_2$ and $Bit_1$ are "0", "1", "0" and "0", respectively. Therefore, the digital code $D_{out}(5)$ output by the SAR ADC 100 is "10100".

Further, the controlling unit 220 controlling the SAR ADC 100 may further include step (c): changing a value of k in a range from 1 to K, and cycling through step (a) to step (b) until K output digital codes $D_{out}(k)$ are generated.

Still taking the SAR ADC 100 shown in FIG. 2, FIG. 3A and FIG. 3B as an example, the controlling unit 220 changes the value of k in the range from 1 to 5, and cycling through the aforementioned steps (a) to (b) until the corresponding 5 output digital codes $D_{out}(k)$ are generated. Specifically, the controlling unit 220 may change the value of k from 5 to 4, and set the $4^{th}$ bit (i.e., $Bit_4$) of the 5-bit binary number output by the SAR ADC 100 to 1. Then, the controlling unit 220 may control the SAR ADC 100 to perform the successive approximation conversion on the defect-sensitive voltage 8.5LSB to determine values of the other bits except $Bit_4$ in the 5-bit binary number (i.e., $Bit_5$, $Bit_3$, $Bit_2$, and $Bit_1$). According to Table 1, when operating normally, the SAR ADC 100 can determine that the digital code $D_{out}(4)$ output by the SAR ADC 100 is "01101". Similarly, the controlling unit 220 can also change the value of k to 3, 2, and 1 sequentially, and cycle through the aforementioned steps (a) to (b) to generate digital codes $D_{out}(3)$="10100", $D_{out}(2)$="10011", and $D_{out}(1)$="10011", respectively.

It should be noted that in the above example, the value of k decreases from 5 to 1 one by one. That is, the value of each bit of the output digital code $D_{out}$ is set sequentially from MSB to LSB. However, the present application is not limited thereto. In other embodiments, the value of each bit of the output digital code $D_{out}$ can also be set sequentially from LSB to MSB, or the values of each bit of the output digital code $D_{out}$ can be set out of order. In addition, in the above example, the controlling unit sets each bit in the K-bit binary number output by the SAR ADC 100 to 1, but the application is not limited thereto. In other embodiments, the controlling unit may set each bit in the K-bit binary number output by the SAR ADC 100 to 0. As shown in Table 1 above, when the defect-sensitive voltage is 8.5LSB, the corresponding five output digital codes $D_{out}(5)$ to $D_{out}(1)$ with correct values can also be obtained by setting each bit in the 5-bit binary number output by the SAR ADC 100 to 0.

When the SAR ADC 100 has no defect, the conversion process and conversion results are described above with reference to the SAR ADC 100 shown in FIG. 2, FIG. 3A and FIG. 3B and Table 1. However, as mentioned above, the SAR ADC 100 may have a defect such as an open-circuited capacitor, a short-circuited capacitor, or a capacitor having inaccurate capacitance. When the SAR ADC 100 has a defect, different results will be produced after the test circuit controls the SAR ADC 100 to perform the analog-to-digital conversion on the defect-sensitive voltage.

Referring to Table 2 below, in a case where the input voltage $V_{in}$ equals to 8.5LSB and the capacitor C4 in the SAR ADC 100 is open-circuited, Table 2 shows the value of each bit of the output digital code $D_{out}$ and its numerical value when each of $Bit_1$ to $Bit_5$ in the output digital code $D_{out}$ is set to 1 or 0. As discussed above, when the capacitor in the SAR ADC 100 is open-circuited, the comparison voltage $V_{cmp}$ at the negative input terminal of the comparator will be inaccurate during the conversion process of the SAR ADC 100, thus causing the conversion result of the SAR ADC 100 to be inaccurate. Comparing Table 2 with Table 1, it can be seen that multiple conversion results of SAR ADC 100 are incorrect due to the open circuit of the capacitor C4.

TABLE 2

| Conversion results when $V_{in}$ equals to 8.5LSB and C4 is open-circuited in the SAR ADC | | | | | | |
|---|---|---|---|---|---|---|
| | $Bit_5$ ($W_5$ = 5) | $Bit_4$ ($W_4$ = 4) | $Bit_3$ ($W_3$ = 3) | $Bit_2$ ($W_2$ = 2) | $Bit_1$ ($W_1$ = 1) | Value of $D_{out}$ |
| $Bit_5$ is set to 1 | 1 | 1 | 0 | 0 | 1 | 10 |
| $Bit_4$ is set to 1 | 1 | 1 | 0 | 0 | 1 | 10 |
| $Bit_3$ is set to 1 | 0 | 1 | 1 | 1 | 1 | 10 |
| $Bit_2$ is set to 1 | 0 | 1 | 1 | 1 | 1 | 10 |
| $Bit_1$ is set to 1 | 1 | 1 | 0 | 0 | 1 | 10 |
| $Bit_5$ is set to 0 | 0 | 1 | 1 | 1 | 1 | 10 |
| $Bit_4$ is set to 0 | 1 | 0 | 0 | 0 | 1 | 6 |
| $Bit_3$ is set to 0 | 1 | 1 | 0 | 0 | 1 | 10 |
| $Bit_2$ is set to 0 | 1 | 1 | 0 | 0 | 1 | 10 |
| $Bit_1$ is set to 0 | 1 | 1 | 0 | 0 | 0 | 9 |

Refer to Table 3 below, in a case where the input voltage $V_{in}$ equals to 8.5LSB and the capacitor C4 in the SAR ADC 100 is short-circuited, Table 3 shows the value of each bit of the output digital code $D_{out}$ and its numerical value when each of $Bit_1$ to $Bit_5$ in the output digital code $D_{out}$ is set to 1 or 0. Comparing Table 3 with Table 1, it can be seen that multiple conversion results of SAR ADC 100 are incorrect due to the short circuit of the capacitor C4.

TABLE 3

| Conversion results when $V_{in}$ equals to 8.5LSB and C4 is short-circuited in the SAR ADC | | | | | | |
|---|---|---|---|---|---|---|
| | $Bit_5$ ($W_5$ = 5) | $Bit_4$ ($W_4$ = 4) | $Bit_3$ ($W_3$ = 3) | $Bit_2$ ($W_2$ = 2) | $Bit_1$ ($W_1$ = 1) | Value of $D_{out}$ |
| $Bit_5$ is set to 1 | 1 | 0 | 1 | 1 | 1 | 11 |
| $Bit_4$ is set to 1 | 0 | 1 | 0 | 0 | 0 | 4 |
| $Bit_3$ is set to 1 | 1 | 0 | 1 | 1 | 1 | 11 |
| $Bit_2$ is set to 1 | 1 | 0 | 1 | 1 | 1 | 11 |
| $Bit_1$ is set to 1 | 1 | 0 | 1 | 1 | 1 | 11 |

TABLE 3-continued

| Conversion results when $V_{in}$ equals to 8.5LSB and C4 is short-circuited in the SAR ADC | | | | | | |
|---|---|---|---|---|---|---|
| | $Bit_5$ ($W_5 = 5$) | $Bit_4$ ($W_4 = 4$) | $Bit_3$ ($W_3 = 3$) | $Bit_2$ ($W_2 = 2$) | $Bit_1$ ($W_1 = 1$) | Value of $D_{out}$ |
| $Bit_5$ is set to 0 | 0 | 0 | 1 | 1 | 1 | 6 |
| $Bit_4$ is set to 0 | 1 | 0 | 1 | 1 | 1 | 11 |
| $Bit_3$ is set to 0 | 1 | 0 | 0 | 1 | 1 | 8 |
| $Bit_2$ is set to 0 | 1 | 0 | 1 | 0 | 1 | 9 |
| $Bit_1$ is set to 0 | 1 | 0 | 1 | 1 | 0 | 10 |

Refer to Table 4 below, in a case where the input voltage $V_{in}$ equals to 8.5LSB and the capacitor C5 in the SAR ADC 100 has an inaccurate capacitance (for example, decreasing from 5C to 2C), Table 4 shows the value of each bit of the output digital code $D_{out}$ and its numerical value when each of $Bit_1$ to $Bit_5$ in the output digital code $D_{out}$ is set to 1 or 0. Comparing Table 4 with Table 1, it can be seen that multiple conversion results of SAR ADC 100 are incorrect due to the inaccurate capacitance of the capacitor C5.

TABLE 4

| Conversion results when $V_{in}$ equals to 8.5LSB and C5 in the SAR ADC has an inaccurate capacitance | | | | | | |
|---|---|---|---|---|---|---|
| | $Bit_5$ ($W_5 = 5$) | $Bit_4$ ($W_4 = 4$) | $Bit_3$ ($W_3 = 3$) | $Bit_2$ ($W_2 = 2$) | $Bit_1$ ($W_1 = 1$) | Value of $D_{out}$ |
| $Bit_5$ is set to 1 | 1 | 1 | 0 | 0 | 0 | 9 |
| $Bit_4$ is set to 1 | 1 | 1 | 0 | 0 | 0 | 9 |
| $Bit_3$ is set to 1 | 1 | 0 | 1 | 0 | 1 | 9 |
| $Bit_2$ is set to 1 | 1 | 0 | 0 | 1 | 1 | 8 |
| $Bit_1$ is set to 1 | 1 | 0 | 1 | 0 | 1 | 9 |
| $Bit_5$ is set to 0 | 0 | 1 | 0 | 1 | 0 | 6 |
| $Bit_4$ is set to 0 | 1 | 0 | 1 | 0 | 1 | 9 |
| $Bit_3$ is set to 0 | 1 | 1 | 0 | 0 | 0 | 9 |
| $Bit_2$ is set to 0 | 1 | 1 | 0 | 0 | 0 | 9 |
| $Bit_1$ is set to 0 | 1 | 1 | 0 | 0 | 0 | 9 |

Referring back to FIG. 1, the test circuit 200 of the present application further includes a determining unit 230. The determining unit 230 is configured to determine whether the SAR ADC 100 has a defect based on the K output digital codes $D_{out}(k)$ generated by the SAR ADC 100.

In some embodiments, as shown in FIG. 1, the determining unit 230 further includes a storage module 232, and the storage module 232 is configured to store the above K output digital codes $D_{out}(k)$. For example, every time after the controlling unit 220 controls the SAR ADC 100 to perform the analog-to-digital conversion on the defect-sensitive voltage to generate a digital code $D_{out}(k)$, the digital code $D_{out}(k)$ is sent to the storage module 232 for storage.

In some embodiments, the determining unit 230 determining whether the SAR ADC 100 has a defect including: comparing a difference between the maximum value max $(D_{out}(k))$ and the minimum value $\min(D_{out}(k))$ of the K output digital codes $D_{out}(k)$ with a predefined threshold ε; determining that the SAR ADC 100 does not have a defect when the difference is less than the predefined threshold ε; and determining that the SAR ADC 100 have a defect when the difference is greater than or equal to the predefined threshold ε. The predefined threshold ε may be determined based on a deterministic error and a random error of the SAR ADC, and may vary with the specific design criteria of the SAR ADC.

Specifically, the conversion process of ADC may be affected by various non-ideal factors and has conversion errors, including a deterministic error and a random error. The deterministic error can be characterized by nonlinear characteristics of the ADC, such as a differential non-linearity (DNL) and an integral non-linearity (INL). The DNL, which is also known as difference non-linearity, may refers to a difference between a distance between two adjacent scales of the ADC and the least significant bit (LSB) of the ADC, which reflects the local microscopic nonlinearity within the entire range. The INL may represent the accuracy of the ADC, which refers to an error between the quantized value and the true value at each numerical point of the ADC, and indicates the absolute error of the measured value. Due to influence of the various non-ideal factors, the DNL and the INL of the ADC are usually not 0. The larger the DNL/INL, the more serious the nonlinearity of the ADC itself, and the greater the error between the output digital result and the analog input. For a SAR ADC, the nonlinearity may come from the mismatch of the circuit, the nonlinearity of the sampling circuit and the comparator circuit, the limited bandwidth of the DAC, etc. For an SAR ADC with given specific design criteria, a degree of non-linearity (the maximum value of DNL/INL) can be determined based on the above nonlinearity sources. Thus, for a certain analog voltage, the error of the converted output result can also be determined. For an SAR ADC based on redundant coding scheme, a difference between the maximum value $\max(D_{out}(k))$ and the minimum value $\min(D_{out}(k))$ caused by the nonlinearity of the SAR ADC itself during the aforementioned defect detection process can be determined, and may be recorded as the deterministic error $\epsilon_{deterministic}$.

Furthermore, in addition to the deterministic error, there may be a random error in the ADC. The random error may mainly come from noises and an aperture uncertainty. For an SAR ADC with given specific design criteria, a level of the random error can be well estimated. Therefore, a difference between the maximum value $\max(D_{out}(k))$ and the minimum value $\min(D_{out}(k))$ caused by the random error of SAR ADC during the aforementioned defect detection process can be determined, and may be recorded as the random error $\epsilon_{random}$.

Under the premise of fully considering the deterministic error $\epsilon_{deterministic}$ and the random error $\epsilon_{random}$ of the SAR ADC, the above predefined threshold $\epsilon$ can be determined by the following Equation (8):

$$\varepsilon \geq \epsilon_{deterministic} + \epsilon_{random}. \quad \text{Equation (8)}$$

It can be seen that the selection of the predefined threshold ε can be determined by the specific design criteria of the SAR ADC. When the predefined threshold ε equals to a sum of the deterministic error $\epsilon_{deterministic}$ and the random error $\epsilon_{random}$, it means the SAR ADC has the smallest tolerance to the defect.

In one example, assuming that the predefined threshold ε is set to 2, the conversion results in Table 1 to Table 4 are used as examples for determination. It can be seen that, $\max(D_{out}(k))-\min(D_{out}(k))=0$ in Table 1, which is less than the predefined threshold 2, and thus it can be determined that the SAR ADC has no defect. On the other hand, $\max(D_{out}(k))-\min(D_{out}(k))=4$ in Table 2, $\max(D_{out}(k))-\min(D_{out}(k))=7$ in Table 3, and $\max(D_{out}(k))-\min(D_{out}(k))=3$ in Table 4. All of them are greater than the predefined threshold 2, and thus it can be determined that the SAR ADC has a defect.

In the above embodiment, by taking the defect-sensitive voltage being 8.5LSB as example, the operation process of the analog-to-digital converter 10 having a built-in self-test function of the present application is described. In other embodiments, there may be a plurality of defect-sensitive voltages. For example, as shown in FIG. 10A, in a case where each bit of $Bit_1$ to $Bit_5$ in the output digital code $D_{out}$ is set to 1, the defect-sensitive voltages include an input voltage in the range of 5 to 7, 8 to 9, 10 to 11, 12 to 13, and 15 to 16; or as shown in FIG. 10 B, in a case where each bit of $Bit_1$ to $Bit_5$ in the output digital code $D_{out}$ is set to 0, the defect-sensitive voltages include any input voltage in the range of 0 to 1, 3 to 6, and 8 to 10. The inputting unit 210 is configured to successively input a plurality of defect-sensitive voltages into the SAR ADC 100. The controlling unit 220 performs the operations of step (a), step (b) and step (c) for each of the plurality of defect-sensitive voltages and obtains the corresponding K output digital codes. $D_{out}(k)$. The determining unit 230 determines whether there is a defect in the SAR ADC 100 based on the K output digital codes $D_{out}(k)$ corresponding to each of the plurality of defect-sensitive voltage. Based on the conversions of the plurality of defect-sensitive voltages, the accuracy and coverage for detecting defects in the SAR ADC 100 can be improved.

In other embodiments, the determining unit 230 not only determines whether the SAR ADC 100 has a defect, but also determines a specific type of the defect in the SAR ADC 100. Continuing to refer to Table 2, Table 3 and Table 4 above, it can be seen that under different defect types, the K output digital codes $D_{out}(k)$ output by the SAR ADC 100 are not the same, but have different features. Based on the different features of these digital codes $D_{out}(k)$, the determining unit 230 can determine a type of the defect in the SAR ADC 100 and further locate the defect.

In some examples, a defect lookup table may be prestored by the determining unit 230, and relationships between different types of defects and the features of the digital code $D_{out}(k)$ are stored in the defect lookup table. After receiving the K output digital codes $D_{out}(k)$ output by the SAR ADC 100, the determining unit 230 can determine a corresponding type of the defect by querying the defect lookup table.

It should be noted that, in the above embodiments, the analog-to-digital converter having a built-in self-test function of the present application is described with reference to the specific structure of the SAR ADC shown in FIG. 2 and FIGS. 3A and 3B, but those skilled in the art can understood that the structure or configuration of the above SAR ADC can be modified without departing from the scope of the present invention. For example, the number of capacitors or switches included in the capacitor or switch array in the SAR ADC may be increased or decreased. For example, the specific implementation of the comparator or the SAR logic circuit may be changed. For example, the reference voltage $V_{ref}$ in the SAR ADC can be generated by the difference between the power supply voltage $V_{dd}$ and the ground voltage $V_{ss}$, or can be generated by any two different voltages $V_1$ and $V_2$ in the SAR ADC. Furthermore, in the above embodiments, the analog-to-digital converter having a built-in self-test function of the present application is explained with a redundant-cap-array-based SAR ADC. However, the present application is not limited thereto. The technical solution of the present application may be used to detect a defect in other types of SAR ADCs based on redundant coding scheme, such as a SAR ADC based on redundant mixed capacitor/resistor arrays, etc.

According to another aspect of the present application, a method for detecting a defect in an SAR ADC is provided.

Figure 12:
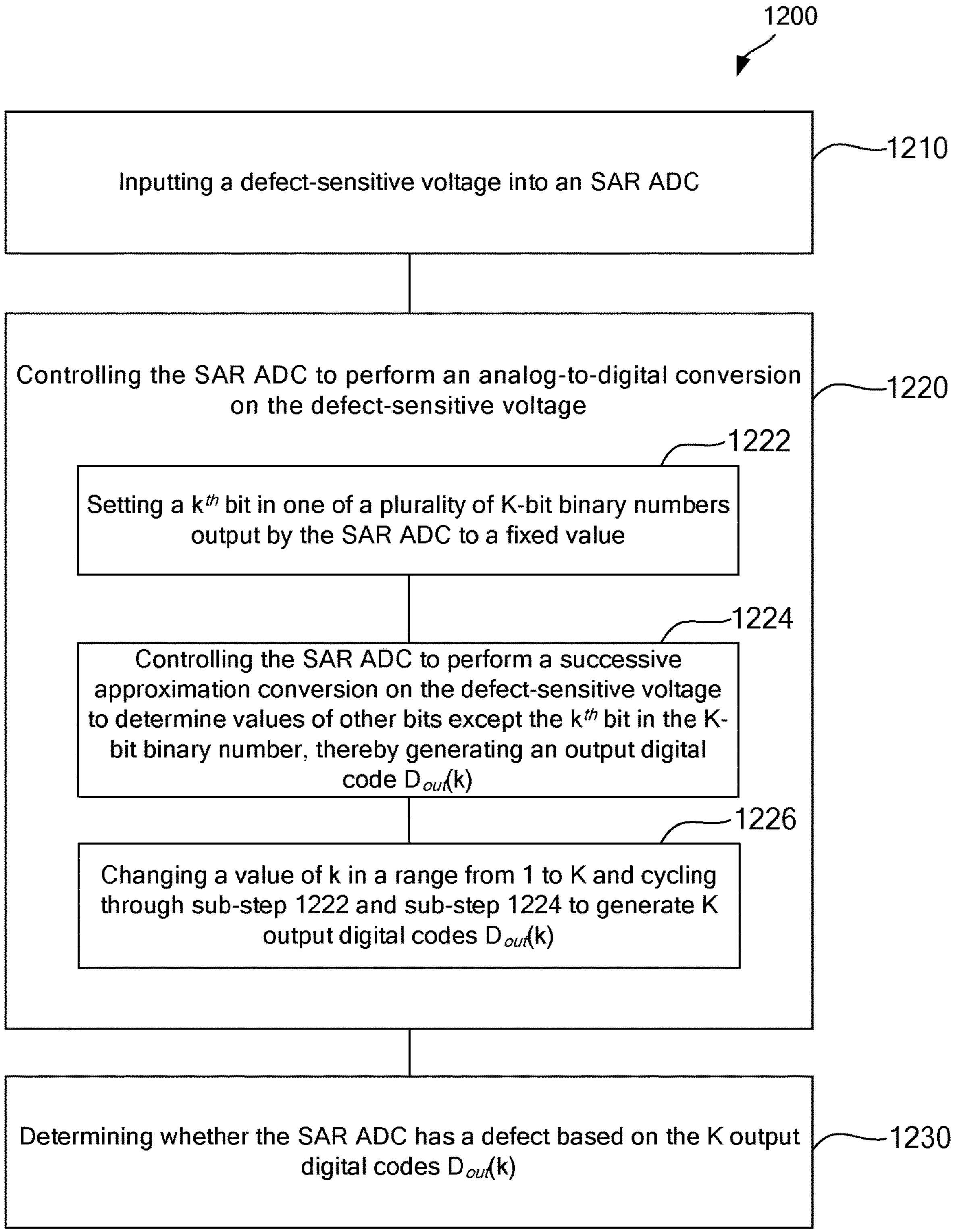
FIG. 12 is a flowchart illustrating a method for detecting a defect in an SAR ADC according to an embodiment of the present application.

Referring to FIG. 12, a flow chart of a method 1200 for detecting a defect in an SAR ADC is illustrated according to an embodiment of the present application. The SAR ADC is based on a redundant coding scheme, and is configured to convert an input voltage $V_{in}$ to an output digital code $D_{out}$, where the input voltage $V_{in}$ can be converted to a value ranging from 0 to M−1, the output digital code $D_{out}$ can be represented by a K-bit binary number, M and K are both positive integers, and $2^K>M$. For example, the method 1200 may be performed by the test circuit 200 shown in FIG. 1 to test the SAR ADC 100.

As shown in FIG. 12, in step S1210, a defect-sensitive voltage is input into a SAR ADC, where a magnitude of the defect-sensitive voltage is representable by a plurality of K-bit binary numbers. Next, in step S1220, the SAR ADC is controlled to perform an analog-to-digital conversion on the defect-sensitive voltage. Referring to FIG. 12, step S1220 may include three sub-steps S1222, S1224 and S1226. In sub-step S1222, a $k^{th}$ bit in one of the plurality of K-bit binary numbers output by the SAR ADC is set to a fixed value, where, $1 \leq k \leq K$; in sub-step S1224, the SAR ADC is controlled to perform a successive approximation conversion on the defect-sensitive voltage to determine values of other bits except the $k^{th}$ bit in the K-bit binary number, thereby generating an output digital code $D_{out}(k)$; and in sub-step S 1226, a value of k is changed in a range from 1 to K (for example, let k equal to K, K−1, . . . , 1 sequentially) and sub-step S1222 and sub-step S1224 are circularly executed to generate K output digital codes $D_{out}(k)$. Afterwards, in step S1230, it is determined whether the SAR ADC has a defect based on the K output digital codes $D_{out}(k)$.

In some embodiments, in sub-step S1222, setting the $k^{th}$ bit in the K-bit binary number output by the SAR ADC to a fixed value may include: setting the $k^{th}$ bit in the K-bit binary number output by the SAR ADC to 0 or 1.

In some embodiments, in sub-step S1222, setting the $k^{th}$ bit in the K-bit binary number output by the SAR ADC to 0 or 1 may include: generating a rewriting signal based on a setting trigger signal, a polarity signal and an initial value signal, wherein the rewriting signal is used to set the $k^{th}$ bit in the K-bit binary number to the fixed value, the setting trigger signal indicates that the $k^{th}$ bit in the K-bit binary number is to be reset, the polarity signal indicates that the fixed value is 0 or 1, and the initial value signal indicates an initial value of the $k^{th}$ bit of a code provided by a successive approximation logic circuit in the SAR ADC; and setting the $k^{th}$ bit in the K-bit binary number output by the SAR ADC to 0 or 1 based on the rewriting signal.

In some embodiments, a most significant bit (MSB) of the K-bit binary number corresponds to k=K, a least significant bit (LSB) of the K-bit binary number corresponds to k=1, and in sub-step S1226, changing the value of k in a range from 1 to K may include: decreasing the value of k from K to 1 one by one.

In some embodiments, the method 1200 may further includes: storing the K output digital codes $D_{out}(k)$.

In some embodiments, in step S1230, determining whether the SAR ADC has a defect based on the K output digital codes $D_{out}(k)$ may include: comparing a difference between a maximum value and a minimum value of the K output digital codes $D_{out}(k)$ with a predefined threshold ε; determining that the SAR ADC does not have a defect when the difference is less than the predefined threshold ε; and determining that the SAR ADC has a defect when the difference is greater than or equal to the predefined threshold ε.

In some embodiments, the method 1200 may further includes: inputting a plurality of defect-sensitive voltages into the SAR ADC successively; performing the operations of sub-steps S1222, S1224 and S1226 on each of the plurality of defect-sensitive voltages to obtain corresponding K output digital codes $D_{out}(k)$; and determining whether the SAR ADC has a defect based on the K output digital codes $D_{out}(k)$ corresponding to each of the plurality of defect-sensitive voltage.

In some embodiments, the method 1200 may further includes: determining a type of the defect in the SAR ADC based on the K output digital codes $D_{out}(k)$.

The detection method 1200 above may be performed by, for example, the test circuit 200 shown in FIG. 1. Therefore, more details about the method 1200 may refer to the above description of the test circuit 200, and will not be described here in.

According to another aspect of the present application, a test circuit for detecting a defect in an SAR ADC is provided.

Figure 13:
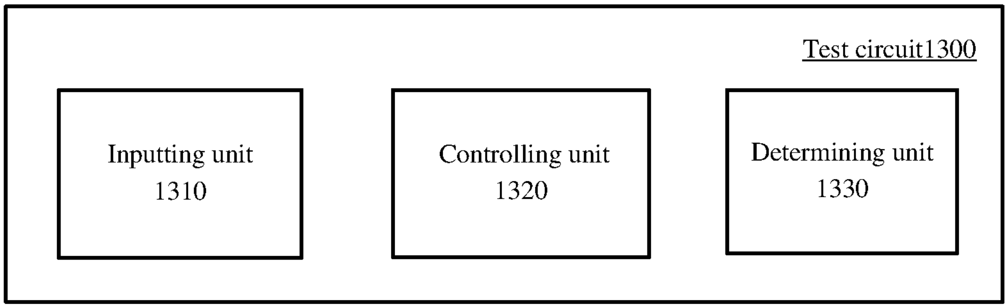
FIG. 13 illustrates a schematic diagram of a test circuit for detecting a defect in an SAR ADC according to an embodiment of the present application.

Referring to FIG. 13, a block diagram of a test circuit 1300 for detecting a defect in an SAR ADC is illustrated according to an embodiment of the present application. The SAR ADC is based on a redundant coding scheme, and is configured to convert an input voltage $V_{in}$ to an output digital code $D_{out}$, where the input voltage $V_{in}$ can be converted to a value ranging from 0 to M−1, the output digital code $D_{out}$ can be represented by a K-bit binary number, M and K are both positive integers, and $2^K>M$.

As shown in FIG. 13, the test circuit 1300 may include an inputting unit 1310, a controlling unit 1320 and a determining unit 1330. The inputting unit 1310 may be configured for inputting a defect-sensitive voltage into a SAR ADC, wherein a magnitude of the defect-sensitive voltage is representable by a plurality of K-bit binary numbers. The controlling unit 1320 is configured for controlling the SAR ADC to perform an analog-to-digital conversion on the defect-sensitive voltage, wherein the controlling includes the following steps: (a) setting a $k^{th}$ bit in one of the plurality of K-bit binary numbers output by the SAR ADC to a fixed value, where 1≤k≤K; (b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$. The determining unit is configured for determining whether the SAR ADC has a defect based on the K output digital codes $D_{out}(k)$.

The test circuit 1300 described above may be similar to the test circuit 200 shown in FIG. 1. A difference therebetween lies in that, the test circuit 1300 is not integrated inside an analog-to-digital converter, but can be used separately. Therefore, different SAR ADCs can be tested. More details about the test circuit 1300 may refer to the above description of the test circuit 200, and will not be described herein.

Compared to existing techniques, the technical solution for detect a defect in a SAR ADC provided in the present application has a shorter test time, and can be integrated into the SAR ADC to achieve an on-chip detection, thereby saving test resources.

It should be noted that, the device or circuit embodiments described above are only for the purpose of illustration. For example, the division of the units is only a logical function division, and there may be other divisions in actual implementations. For example, multiple units or components may be combined or may be integrate into another system, or some features can be omitted or not implemented. In addition, the displayed or discussed mutual coupling, direct coupling or communication connection may be indirect coupling or indirect communication connection through some interfaces, devices or units in electrical or other forms. The units described as separate components may or may not be physically separated, and the components displayed as units may or may not be physical units, that is, they may be located in one place, or they may be distributed on multiple network units. Some or all of the units may be selected according to actual needs to achieve the objectives of the solutions of the embodiments. In addition, the steps of the above-described methods can be omitted or added as required. In addition, multiple steps can be executed simultaneously or sequentially. When multiple different steps are executed sequentially, the execution order may be different in different embodiments.

In addition, each functional unit in various embodiments of the present invention can be integrated into one processing unit, or each unit can exist physically alone, or two or more units can be integrated into one unit. The above integrated units can be implemented in the form of hardware or software functional units. If the integrated unit is implemented in the form of a software functional unit and sold or used as an independent product, it may be stored in a computer-readable storage medium. Based on this understanding, the technical solution of the present invention is essentially or contributes to the existing technology, or all or part of the technical solution can be embodied in the form of a software product, and the software product is stored in a storage medium, including several instructions to cause a computer device (which can be a personal computer, a mobile terminal, a server or a network device, etc.) to execute all or part of the steps of the method described in various embodiments of the present invention.

Those skilled in the art will be able to understand and implement other changes to the disclosed embodiments by studying the specification, disclosure, drawings and appended claims. In the claims, the wordings "comprise", "comprising", "include" and "including" do not exclude other elements and steps, and the wordings "a" and "an" do not exclude the plural. In the practical application of the present application, one component may perform the functions of a plurality of technical features cited in the claims. Any reference numeral in the claims should not be construed as limit to the scope.

The invention claimed is:

1. An analog-to-digital converter having a built-in self-test function, comprising:

a successive-approximation-register analog-to-digital conversion circuit (SAR ADC) based on a redundant coding scheme;

an inputting unit configured for inputting a defect-sensitive voltage into the SAR ADC, wherein a magnitude of the defect-sensitive voltage is representable by a plurality of K-bit binary numbers, and K is a positive integer;

a controlling unit configured for controlling the SAR ADC to perform an analog-to-digital conversion on the defect-sensitive voltage, wherein the controlling comprises the following steps:

(a) setting a $k^{th}$ bit in one of the plurality of K-bit binary numbers output by the SAR ADC to a fixed value;

(b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and a determining unit configured for determining whether the SAR ADC has a defect based on the K output digital codes $D_{out}(k)$.

2. The analog-to-digital converter of claim 1, wherein the SAR ADC is configured to convert the input voltage to a digital value ranging from 0 to (M−1), wherein M is a positive integer greater than 1, and $M<2^K$.

3. The analog-to-digital converter of claim 1, wherein the fixed value is 0 or 1.

4. The analog-to-digital converter of claim 3, wherein the controlling unit comprises a setting circuit configured to generate a rewriting signal based on a setting trigger signal, a polarity signal and an initial value signal, and wherein the rewriting signal is used to set the $k^{th}$ bit in the K-bit binary number to the fixed value, the setting trigger signal indicates that the $k^{th}$ bit in the K-bit binary number is to be reset, the polarity signal indicates that the fixed value is 0 or 1, and the initial value signal indicates an initial value of the $k^{th}$ bit of a code provided by a successive approximation logic circuit in the SAR ADC.

5. The analog-to-digital converter of claim 1, wherein a most significant bit (MSB) of the K-bit binary number corresponds to k=K, a least significant bit (LSB) of the K-bit binary number corresponds to k=1, and the controlling unit is configured to decrease the value of k from K to 1 one by one.

6. The analog-to-digital converter of claim 1, wherein the determining unit further comprises a storage module configured to store the K output digital codes $D_{out}(k)$.

7. The analog-to-digital converter of claim 6, wherein the determining unit is further configured for:

comparing a difference between a maximum value and a minimum value of the K output digital codes $D_{out}(k)$ with a predefined threshold ε;

determining that the SAR ADC does not have a defect when the difference is less than the predefined threshold ε; and determining that the SAR ADC has a defect when the difference is greater than or equal to the predefined threshold ε.

8. The analog-to-digital converter of claim 1, wherein the inputting unit is configured to successively input a plurality of defect-sensitive voltages into the SAR ADC, the controlling unit is configured to perform the operations of step (a), step (b) and step (c) on each of the plurality of defect-sensitive voltages to obtain corresponding K output digital codes $D_{out}(k)$, and the determining unit is configured to determine whether the SAR ADC has a defect based on the K output digital codes $D_{out}(k)$ corresponding to each of the plurality of defect-sensitive voltages.

9. The analog-to-digital converter of claim 1, wherein the determining unit is further configured to determine a type of the defect in the SAR ADC based on the K output digital codes $D_{out}(k)$.

10. The analog-to-digital converter of claim 1, wherein the SAR ADC comprises a redundant capacitor array.

11. A method for detecting a defect in an analog-to-digital conversion circuit, comprising:

inputting a defect-sensitive voltage into a successive-approximation-register analog-to-digital conversion circuit (SAR ADC) based on a redundant coding scheme, where a magnitude of the defect-sensitive voltage is representable by a plurality of K-bit binary numbers;

controlling the SAR ADC to perform an analog-to-digital conversion on the defect-sensitive voltage, and the controlling comprises the following steps:

(a) setting a $k^{th}$ bit in one of the plurality of K-bit binary numbers output by the SAR ADC to a fixed value;

(b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and determining whether the SAR ADC has a defect based on the K output digital codes $D_{out}(k)$.

12. The method of claim 11, wherein the SAR ADC is configured to convert the input voltage to a digital value ranging from 0 to (M−1), where M is a positive integer greater than 1, and $M<2^K$.

13. The method of claim 11, wherein setting the $k^{th}$ bit in one of the plurality of K-bit binary numbers output by the SAR ADC to a fixed value comprises: setting the $k^{th}$ bit in the K-bit binary number output by the SAR ADC to 0 or 1.

14. The method of claim 13, wherein setting the $k^{th}$ bit in the K-bit binary number output by the SAR ADC to 0 or 1 comprises:

generating a rewriting signal based on a setting trigger signal, a polarity signal and an initial value signal, wherein the rewriting signal is used to set the $k^{th}$ bit in the K-bit binary number to the fixed value, the setting trigger signal indicates that the $k^{th}$ bit in the K-bit binary number is to be reset, the polarity signal indicates that the fixed value is 0 or 1, and the initial value signal indicates an initial value of the $k^{th}$ bit of a code provided by a successive approximation logic circuit in the SAR ADC; and setting the $k^{th}$ bit in the K-bit binary number output by the SAR ADC to 0 or 1 based on the rewriting signal.

15. The method of claim 11, wherein a most significant bit (MSB) of the K-bit binary number corresponds to k=K, a least significant bit (LSB) of the K-bit binary number corresponds to k=1, and changing the value of k in a range from 1 to K comprises: decreasing the value of k from K to 1 one by one.

16. The method of claim 11, further comprising:

storing the K output digital codes $D_{out}(k)$.

17. The method of claim 16, wherein determining whether the SAR ADC has a defect based on the K output digital codes $D_{out}(k)$ comprises:

comparing a difference between a maximum value and a minimum value of the K output digital codes $D_{out}(k)$ with a predefined threshold ε;

determining that the SAR ADC does not have a defect when the difference is less than the predefined threshold ε; and determining that the SAR ADC has a defect when the difference is greater than or equal to the predefined threshold ε.

18. The method of claim 11, further comprising:

inputting a plurality of defect-sensitive voltages into the SAR ADC successively;

performing the operations of step (a), step (b) and step (c) on each of the plurality of defect-sensitive voltages to obtain corresponding K output digital codes $D_{out}(k)$; and determining whether the SAR ADC has a defect based on the K output digital codes $D_{out}(k)$ corresponding to each of the plurality of defect-sensitive voltage.

19. The method of claim 11, further comprising:

determining a type of the defect in the SAR ADC based on the K output digital codes $D_{out}(k)$.

20. A test circuit for detecting a defect in an analog-to-digital conversion circuit, comprising:

an inputting unit configured for inputting a defect-sensitive voltage into a successive-approximation-register analog-to-digital conversion circuit (SAR ADC) based on a redundant coding scheme, wherein a magnitude of the defect-sensitive voltage is representable by a plurality of K-bit binary numbers, and K is a positive integer;

a controlling unit configured for controlling the SAR ADC to perform an analog-to-digital conversion on the defect-sensitive voltage, wherein the controlling comprises the following steps:

(a) setting a $k^{th}$ bit in one of the plurality of K-bit binary numbers output by the SAR ADC to a fixed value;

(b) controlling the SAR ADC to perform a successive approximation conversion on the defect-sensitive voltage to determine values of other bits except the $k^{th}$ bit in the K-bit binary number, thereby generating an output digital code $D_{out}(k)$; and (c) changing a value of k in a range from 1 to K and cycling through step (a) to step (b) to generate K output digital codes $D_{out}(k)$; and a determining unit configured for determining whether the SAR ADC has a defect based on the K output digital codes $D_{out}(k)$.

* * * * *